United States Patent
Sasaki et al.

(10) Patent No.: US 7,884,455 B2
(45) Date of Patent: Feb. 8, 2011

(54) SEMICONDUCTOR DEVICE

(75) Inventors: Taishi Sasaki, Chiyoda-ku (JP); Mikio Ishihara, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 293 days.

(21) Appl. No.: 12/051,221

(22) Filed: Mar. 19, 2008

(65) Prior Publication Data

US 2009/0057929 A1  Mar. 5, 2009

(30) Foreign Application Priority Data

Aug. 31, 2007  (JP) .................... 2007-226353

(51) Int. Cl.
*H01L 23/02* (2006.01)
(52) U.S. Cl. .......... 257/678; 257/698; 257/675; 257/706; 257/796; 257/E23.08; 257/E23.081
(58) Field of Classification Search .......... 257/667, 257/678–733, 787–796, E23.001–E23.194
See application file for complete search history.

(56) References Cited

U.S. PATENT DOCUMENTS

| | | | |
|---|---|---|---|
| 5,491,361 A * | 2/1996 | Stupian et al. | 257/680 |
| 5,612,576 A * | 3/1997 | Wilson et al. | 257/788 |
| 5,721,450 A * | 2/1998 | Miles | 257/667 |
| 5,767,446 A * | 6/1998 | Ha et al. | 174/523 |
| 5,917,234 A * | 6/1999 | Tsuruzono | 257/667 |
| 5,919,329 A * | 7/1999 | Banks et al. | 156/281 |
| 5,994,784 A * | 11/1999 | Ahmad | 257/784 |
| 6,054,755 A * | 4/2000 | Takamichi et al. | 257/667 |
| 6,534,847 B2 * | 3/2003 | Hikita et al. | 257/678 |
| 6,597,063 B1 | 7/2003 | Shimizu et al. | |
| 6,700,194 B2 | 3/2004 | Nakajima et al. | |
| 2001/0015478 A1 | 8/2001 | Tsunoda et al. | |
| 2009/0230487 A1 * | 9/2009 | Saitoh et al. | 257/419 |

FOREIGN PATENT DOCUMENTS

| | | |
|---|---|---|
| JP | 8-274219 | 10/1996 |
| JP | 2006-319084 | 11/2006 |

* cited by examiner

*Primary Examiner*—Jasmine J Clark
(74) *Attorney, Agent, or Firm*—Oblon, Spivak, McClelland, Maier & Neustadt, L.L.P.

(57) ABSTRACT

A power module includes: an encapsulation-target portion having at least one semiconductor element; and an encapsulation member that has first and second planes between which the encapsulation-target portion is interposed, and that encapsulates the encapsulation-target portion. The encapsulation member has, on the at least one semiconductor element, at least one opening that exposes part of a surface of the encapsulation-target portion the surface being on a side of the first plane. Thus, a semiconductor device of which size can be reduced can be provided.

23 Claims, 33 Drawing Sheets

US 7,884,455 B2

SEMICONDUCTOR DEVICE

BACKGROUND OF THE INVENTION

1. Field of the Invention

The present invention relates to a semiconductor device, and in particular, to a semiconductor device having a semiconductor element encapsulated by an encapsulation member.

2. Description of the Background Art

As a semiconductor device for use as an inverter, there is a power module having a plurality of semiconductor elements such as IGBTs (Insulated Gate Bipolar Transistors), free wheel diodes and the like encapsulated by a mold resin and an insulating sheet. For example, Japanese Patent Laying-Open No. 2006-319084 discloses such a power module.

As a technique of suppressing the mounting area of an encapsulated semiconductor device, for example, there is a technique disclosed by Japanese Patent Laying-Open No. 08-274219. The disclosed semiconductor device includes an IC chip, a tab on which the IC chip is placed, a lead terminal, a thin metal wire connecting the lead terminal and the IC chip, and a resin mold. The resin mold is provided with a hole, which extends from the lower surface of the resin mold and reaches the lead terminal. A conductive rod-like terminal is inserted to pass through the hole. Electric connection between a structure outside the semiconductor device and the IC chip encapsulated by the resin mold is established via a serial connection portion of the rod-like terminal, the lead terminal and the thin metal wire.

According to the technique of Japanese Patent Laying-Open No. 08-274219, each hole is provided so as to reach the lead terminal. The lead terminal is provided on the outer circumferential side of the tab on which the IC chip (semiconductor element) is placed. Accordingly, the holes are also distributed on the outer circumferential side around the region where the semiconductor element and the tab are provided. That is, the distribution range of the holes is wide. This introduces a problem of an increase in the size of a substrate that is connected to the semiconductor device via the holes. Additionally, since the resin mold and the lead terminal must be provided on the outer circumferential side, there has also been a problem of an increase in the size of the semiconductor device.

SUMMARY OF THE INVENTION

Accordingly, an object of the present invention is to provide a semiconductor device that can be reduced in size.

A semiconductor device of the present invention includes: an encapsulation-target portion having at least one semiconductor element; and an encapsulation member that has first and second planes between which the encapsulation-target portion is interposed, and that encapsulates the encapsulation-target portion. The encapsulation member has, on the at least one semiconductor element, at least one opening that exposes part of a surface of the encapsulation-target portion. The surface is on a side of the first plane.

According to the present invention, the encapsulation member has, on the semiconductor element, an opening that exposes part of the surface of the encapsulation-target portion, which is on the side of the first plane. Thus, electric connection between the semiconductor device and an external structure can be established via the first plane on the semiconductor element of the encapsulation member. Accordingly, as compared with a case where electric connection is established detouring the first plane on the semiconductor element, electric connection can be established in a smaller space. Therefore, the semiconductor device or the external structure connected to the semiconductor device is reduced in size.

The foregoing and other objects, features, aspects and advantages of the present invention will become more apparent from the following detailed description of the present invention when taken in conjunction with the accompanying drawings.

BRIEF DESCRIPTION OF THE DRAWINGS

In FIG. 2, an encapsulation member is shown only by its outer edge.

In FIG. 15, an encapsulation member is shown only by its outer edge.

In FIG. 19, an encapsulation member is shown only by its outer edge.

In FIG. 21, an encapsulation member is shown only by its outer edge.

In FIG. 24, an encapsulation member is shown only by its outer edge.

In FIG. 28, an encapsulation member is shown only by its outer edge.

In FIG. 32, an encapsulation member is shown only by its outer edge.

In FIG. 42, an encapsulation member is shown only by its outer edge.

In FIG. 44, an encapsulation member is shown only by its outer edge.

In FIG. 50, an encapsulation member is shown only by its outer edge.

DESCRIPTION OF THE PREFERRED EMBODIMENTS

In the following, embodiments of the present invention will be described based on the drawings.

First Embodiment

First, using FIGS. 1-4, a configuration of a power module as a semiconductor device in the present embodiment is described.

Figure 1:
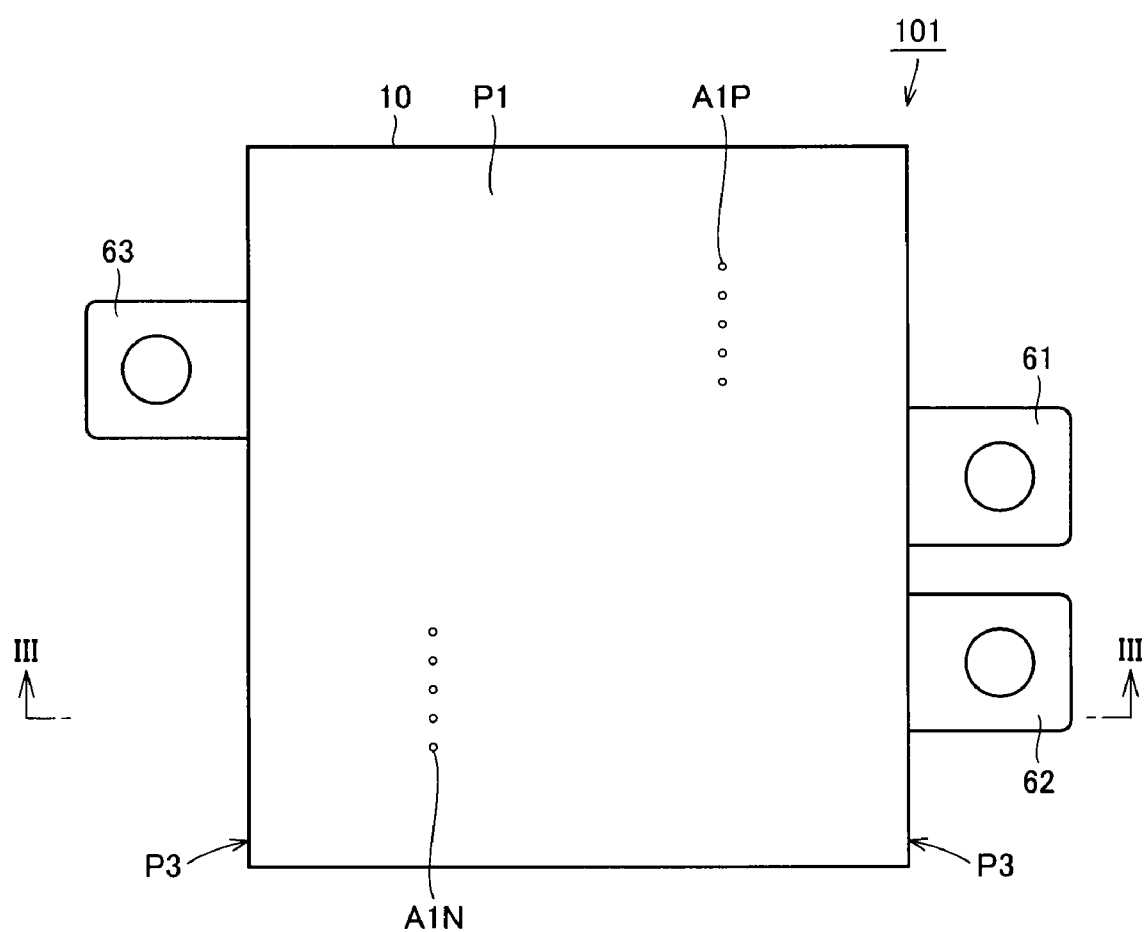
FIGS. 1 and 2 are plan views schematically showing a configuration of a power module as a semiconductor device in a first embodiment of the present invention.
Figure 2:
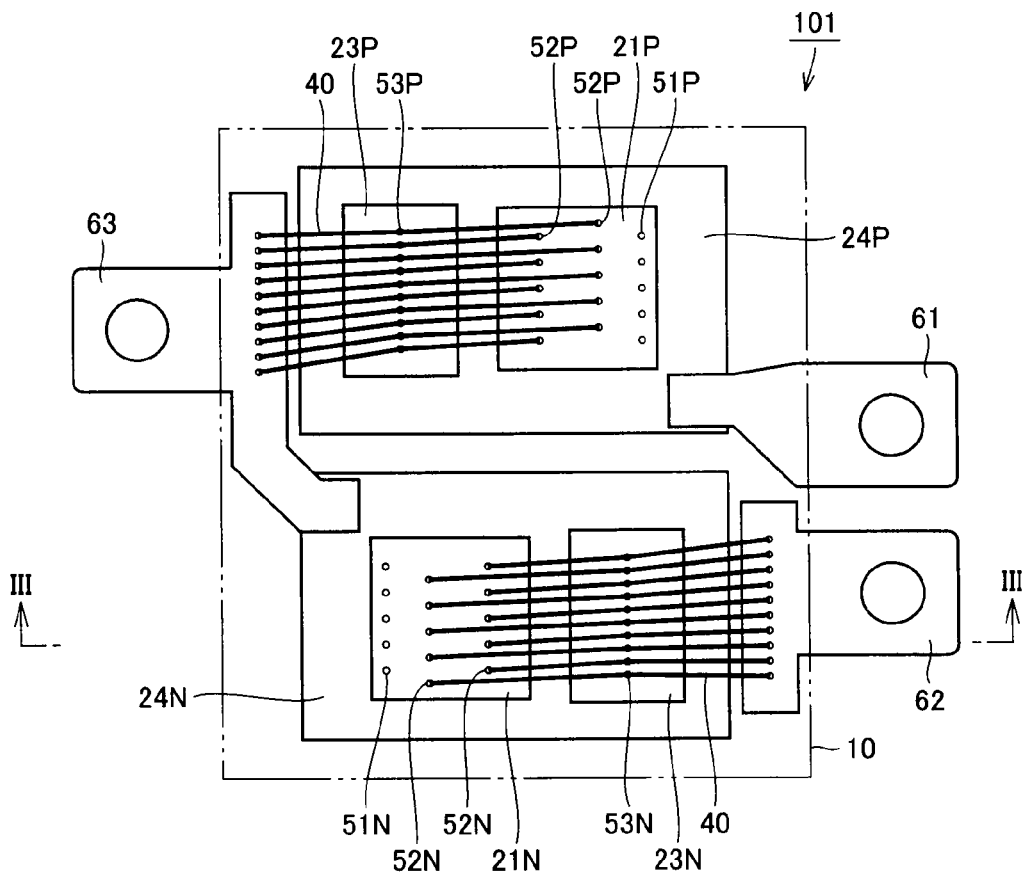
Figure 3:
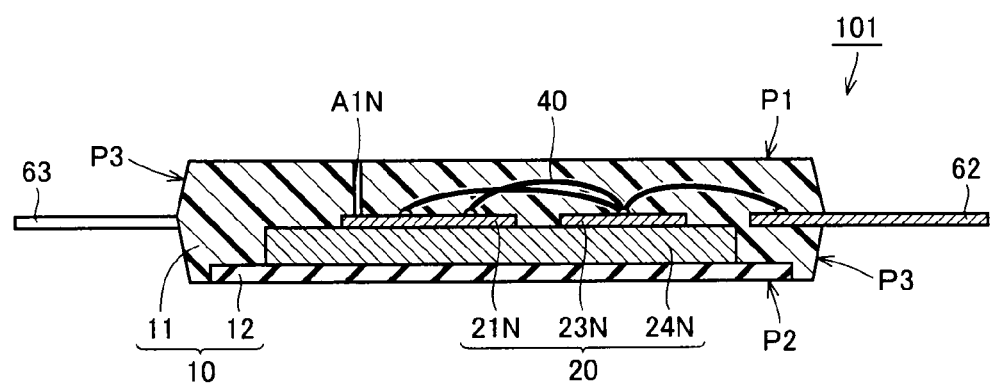
FIG. 3 is a schematic cross-sectional view along line III-III in each of FIGS. 1 and 2.

Referring to FIGS. 1-3, a power module 101 as a semiconductor device in the present embodiment includes an encapsulation-target portion 20, an encapsulation member 10, leads 61-63, and aluminum wires 40.

Encapsulation-target portion 20 includes IGBT elements 21P and 21N, diode elements 23P and 23N, and heat spreaders 24P and 24N. Accordingly, encapsulation-target portion 20 includes a plurality of semiconductor elements.

Encapsulation member 10 has a first plane P1, a second plane P2, and a third plane P3 connecting first plane P1 and second plane P2 to each other. Encapsulation-target portion 20 is located between first plane P1 and second plane P2 and encapsulated by encapsulation member 10.

Encapsulation member 10 has contact holes A1P and contact holes A1N, which are openings, on IGBT element 21P and IGBT element 21N, respectively. IGBT elements 21P and 21N have part of their respective surfaces on the first plane P1 side exposed by contact holes A1P and A1N. That is, encapsulation-target portion 20 has part of its surface on the first plane P1 side exposed by contact holes A1P and A1N. Contact holes A1P and A1N each have a circular cross-sectional shape in parallel with first plane P1.

Encapsulation member 10 includes a mold resin 11 and an insulating sheet 12. Mold resin 11 and insulating sheet 12 are positioned on the first plane P1 side and the second plane P2 side relative to encapsulation-target portion 20, respectively. The material of insulating sheet 12 is higher in thermal conductivity than the material of mold resin 11.

Mold resin 11 is a member containing a resin material. Mold resin 11 may further contain a filler member made of an inorganic material. The material of mold resin 11 is preferably a material suitable for the transfer mold method. That is, a material having sufficient flowability in performing resin molding is preferable.

Insulating sheet 12 includes a sheet-like member made of an insulator. This insulator is, for example, epoxy resin. Insulating sheet 12 may further include a protection layer (not shown) made of metal over the surface of the sheet-like member. This metal may be copper (Cu), for example.

Aluminum wires 40 are thin metal wires electrically connecting at least one of semiconductor elements 21P, 21N, 23P, and 23N, to lead 62 or 63.

Figure 4:
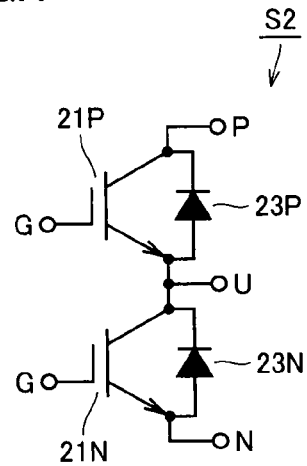
FIG. 4 schematically shows a circuit configuration of the power module as the semiconductor device in the first embodiment of the present invention.

Referring to FIGS. 2 and 4, power module 101 has a circuit configuration S2. IGBT elements 21P and 21N in circuit configuration S2 each have an emitter terminal and a collector terminal as main terminals, which are terminals for inputting and outputting main current. IGBT elements 21P and 21N are each a semiconductor switching element that switches the current path between the emitter terminal and the collector terminal. The switching is performed in accordance with a control signal applied to gate G.

In circuit configuration S2, the emitter of IGBT element 21P and the collector of IGBT element 21N are connected in series. In this serial connection, the end on IGBT element 21P side and the end on IGBT element 21N side correspond to input terminal P and input terminal N, respectively. Between IGBT elements 21P and 21N, an output terminal U is drawn. To IGBT elements 21P and 21N, diode elements 23P and 23N are connected in parallel as free wheel diodes, respectively. Thus, in circuit configuration S2, as a control signal is applied to each gate G in a state where positive and negative voltages are respectively applied to input terminals P and N, an output corresponding to the control signal is produced from output terminal U.

IGBT element 21P and IGBT element 21N respectively have control pads 51P and control pads 51N corresponding to gate G. Control pads 51P and 51N are opposed to contact holes A1P and A1N, respectively. IGBT element 21P and IGBT element 21N respectively have emitter pads 52P and emitter pads 52N corresponding to the emitter terminal. IGBT element 21P and IGBT element 21N have their respective collector terminals soldered as opposed to heat spreaders 24P and 24N, respectively.

Diode element 23P and diode element 23N have, on their one side, diode pads (anode) 53P and diode pads (anode) 53N, respectively. Diode element 23P and diode element 23N have their other side (cathode side) soldered as opposed to heat spreaders 24P and 24N, respectively.

Referring to FIGS. 1-4, leads 61-63 protrude from the inside of encapsulation member 10 through third plane P3 to the outside of power module 101. Leads 61-63 are electrically connected to encapsulation-target portion 20 in encapsulation member 10. Specifically, P lead 61, N lead 62 and U lead 63 are connected such that they correspond to input terminals P and N, and output terminal U in circuit configuration S2, respectively.

Heat spreader 24P is provided on IGBT element 21P and diode element 23P and on the second plane P2 side. Heat spreader 24N is provided on IGBT element 21N and diode element 23N and on the second plane P2 side. Heat spreaders 24P and 24N are members made of a material having high electric conductivity and thermal conductivity, and may each be a plate-like member made of copper (Cu) having a thickness of 3 mm, for example. Heat spreaders 24P and 24N have a function as part of wiring path in circuit configuration S2 and a function of facilitating heat dissipation by diffusing heat from semiconductor elements 21P, 23P, 21N, and 23N included in encapsulation-target portion 20. The surfaces of heat spreaders 24P and 24N, which are to be in contact with mold resin 11, are formed to have uneven shape in order to improve adhesion.

Next, a configuration where a control substrate is added to power module 101 of the present embodiment is described.

Figure 8:
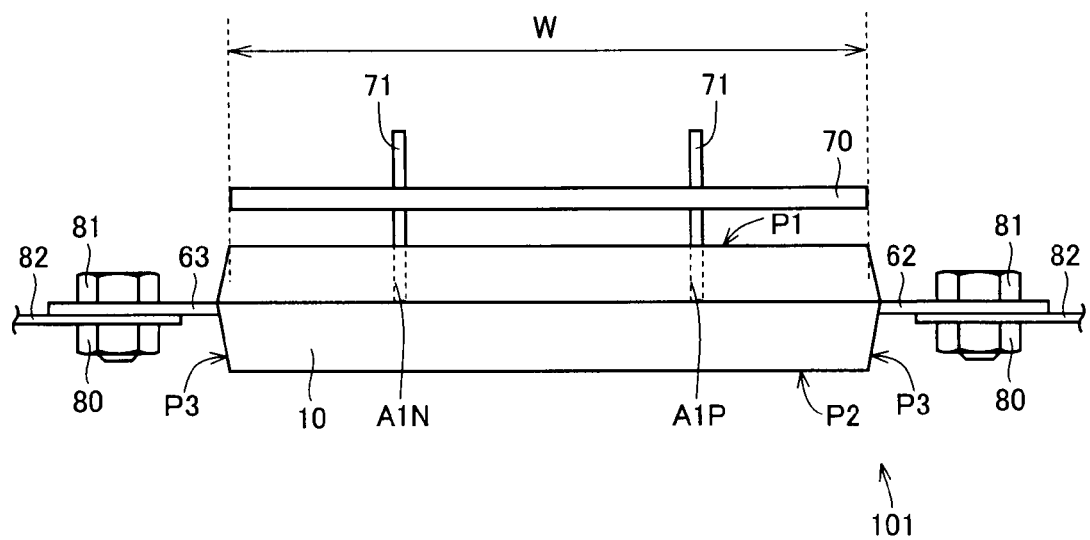
FIG. 8 is a schematic side view showing a state where a control substrate is added to the power module as the semiconductor device in the first embodiment of the present invention.

Referring mainly to FIG. 8, a control substrate 70 is a substrate having a function of outputting a control signal. Control substrate 70 is arranged near first plane P1 in parallel therewith. Control substrate 70 is connected so as to provide control signals to power module 101 via control signal pins 71.

Specifically, control signal pin 71 is inserted in each of contact holes A1P and A1N (FIG. 1) of power module 101. Thus, via control signal pins 71, control substrate 70 is electrically connected to each of control pads 51P and 51N. Each of leads 61, 62 and 63 is connected to an external structure 82 by a screw 81 and a nut 80.

As contact holes A1P and A1N open on the first plane P1 side of power module 101, they are positioned within a range of a width W of first plane P1. Accordingly, even when the size of control substrate 70 is not greater than width W, control substrate 70 can be arranged to be opposed to contact holes A1P and A1N. As a result, electric connection via each of contact holes A1P and A1N can be established in the region between control substrate 70 and first plane P1 of power module 101.

Next, a manufacturing method of the power module as the semiconductor device in the present embodiment is described using FIGS. 9-13.

Figure 9:
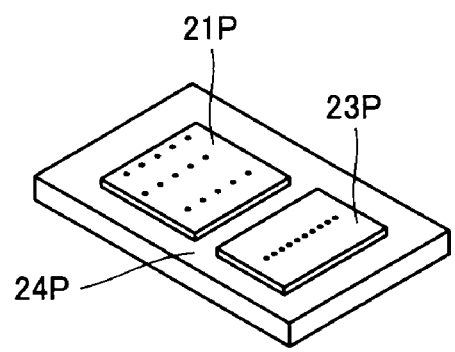
FIGS. 9-13 are schematic perspective views sequentially showing first to fifth steps in a manufacturing method of the power module as the semiconductor device in the first embodiment of the present invention.

Referring to FIG. 9, in a die-bond step, IGBT element 21P and diode element 23P are soldered on heat spreader 24P. While it is not shown in FIG. 9, similarly, IGBT element 21N and diode element 23N are soldered on heat spreader 24N.

Figure 10:
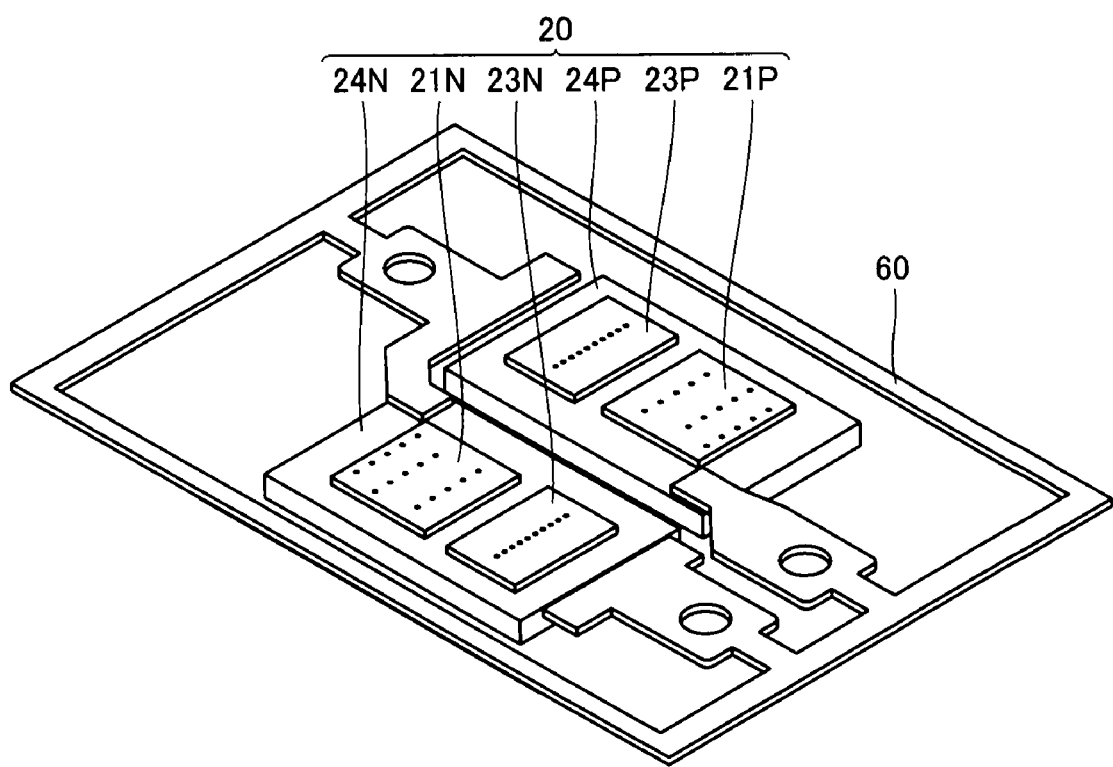

Referring mainly to FIG. 10, in a frame-joining step, each of heat spreaders 24P and 24N and lead frame 60 are joined by the ultrasonic welding. Lead frame 60 is a member that has portions to be leads 61-63 (FIG. 2). The method of joining in this step is not limited to the ultrasonic welding, and they may be joined by soldering or the like.

Figure 11:
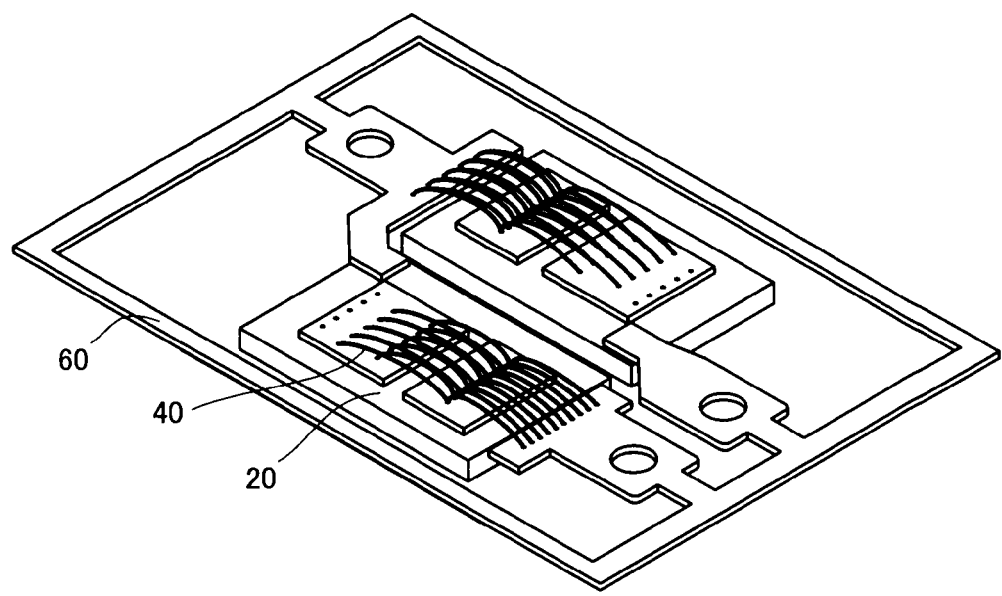

Referring mainly to FIG. 11, in a wire-bond step, wiring by aluminum wires 40 is performed. On the lower surfaces of heat spreaders 24P and 24N, insulating sheet 12 (FIG. 3) is bonded.

Figure 12:
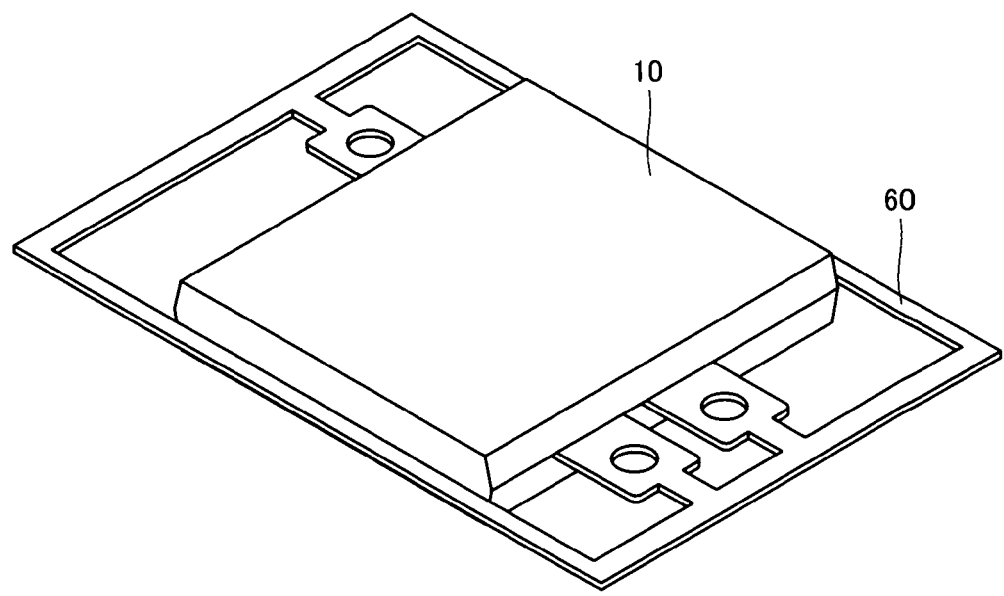

Referring mainly to FIG. 12, in a mold step, mold resin 11 (FIGS. 1-3) is formed by the transfer molding. First, a mold is arranged so that its cavity is positioned in a position where mold resin 11 is to be formed. Thereafter, heat and pressure are applied to resin, such as powder or tablet epoxy resin, thereby melting the resin. The resin thus rendered to be in a low-viscosity state is injected into the cavity. Thereafter, as the molten resin cures, mold resin 11 is formed.

Figure 13:
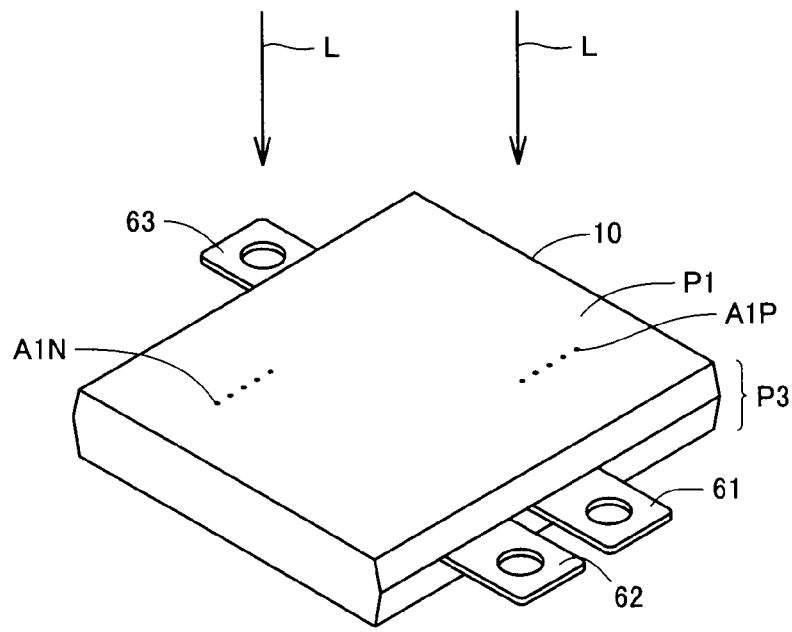

Referring to FIGS. 12 and 13, in a lead-cut step, unnecessary portions of lead frame 60 are cut, thereby forming leads 61-63.

Referring to FIG. 13, by working of laser light L, contact holes A1P and A1N are formed on the first plane P1 side of encapsulation member 10.

Thus, power module 101 (FIGS. 1-3) is manufactured.

Next, variations of the present embodiment is described.

Figure 5:
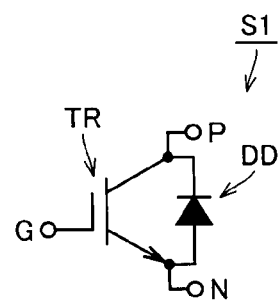
FIGS. 5-7 schematically show a circuit configuration of a power module as a semiconductor device in each of first to third variations of the first embodiment of the present invention.

Referring mainly to FIG. 5, a power module having a circuit configuration S1 has a set of IGBT element TR and diode DD connected in parallel with each other. That is, it is what is called the "1 in 1" power module. It is to be noted that, in power module 101 in the present embodiment having circuit configuration S2 (FIG. 4), one power module 101 has two sets of the above-described IGBT element TR and diode DD. That is, power module 101 is what is called the "2 in 1" power module.

Figure 6:
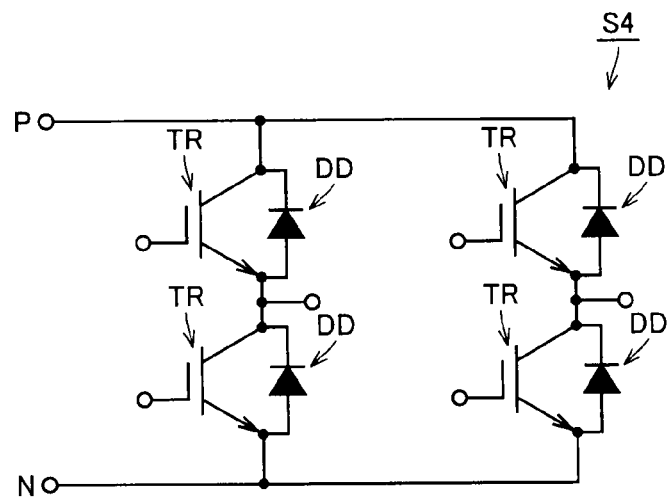
Figure 7:
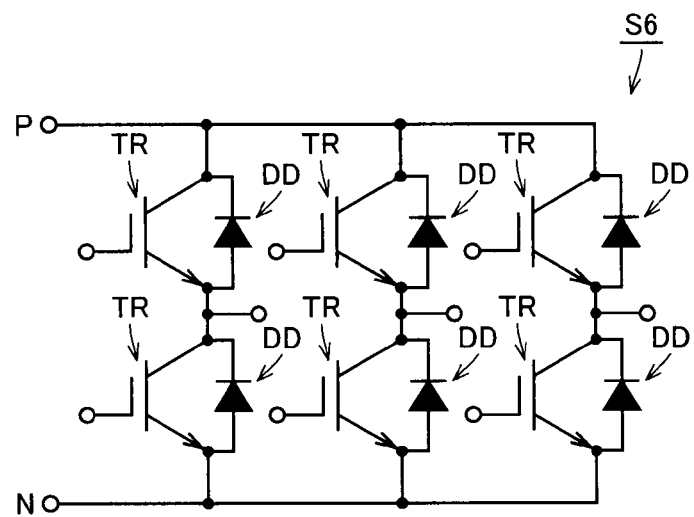

Referring to FIGS. 6 and 7, circuit configurations S4 and S6 correspond to what are called the "4 in 1" and "6 in 1" power modules, respectively.

Figure 14:
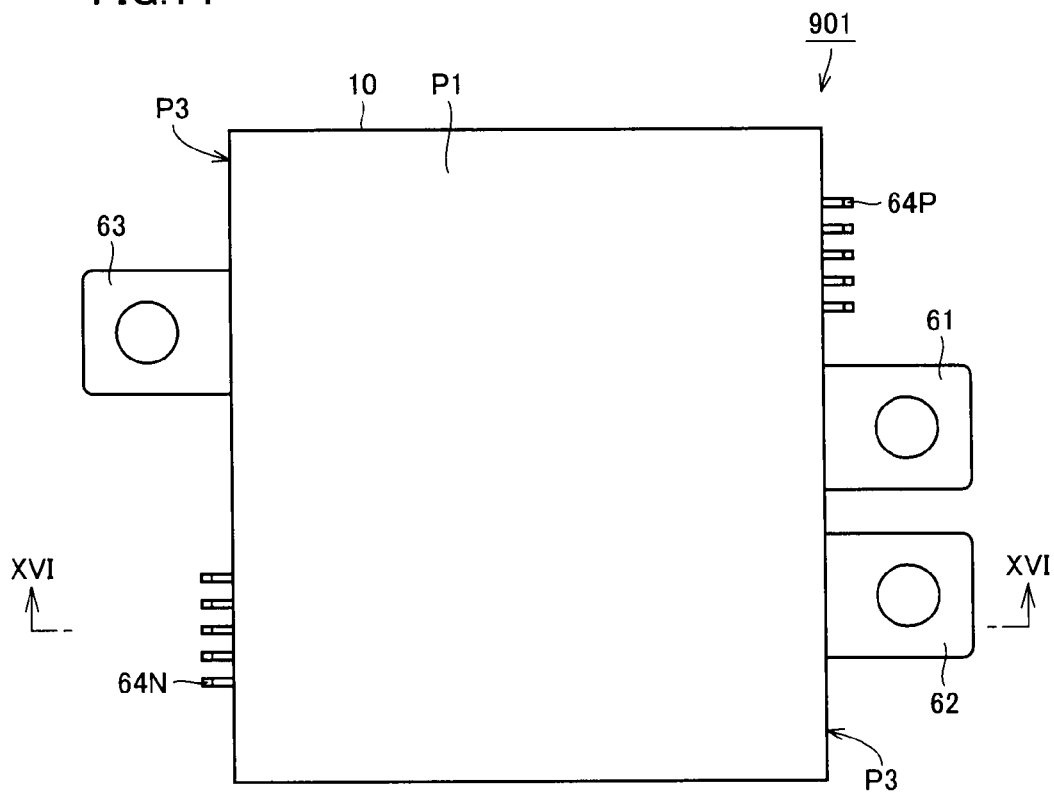
FIGS. 14 and 15 are plan views schematically showing a configuration of a power module as a semiconductor device in a comparative example.
Figure 15:
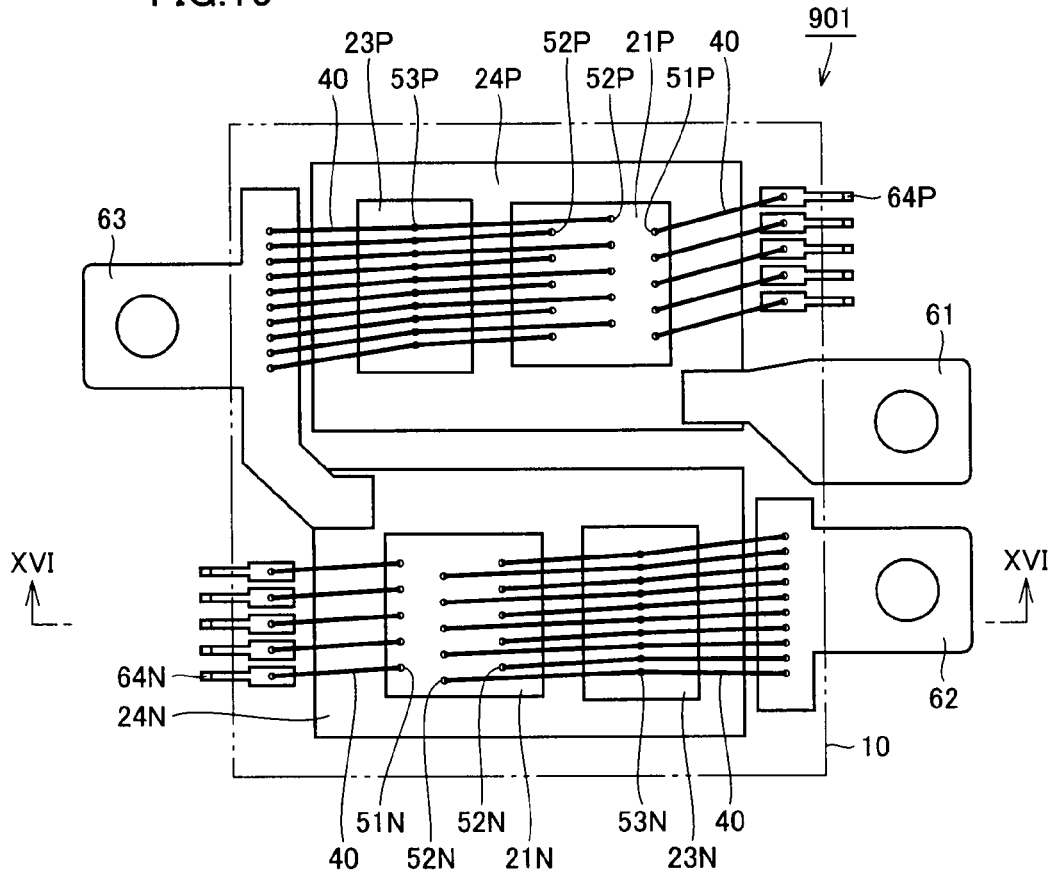
Figure 16:
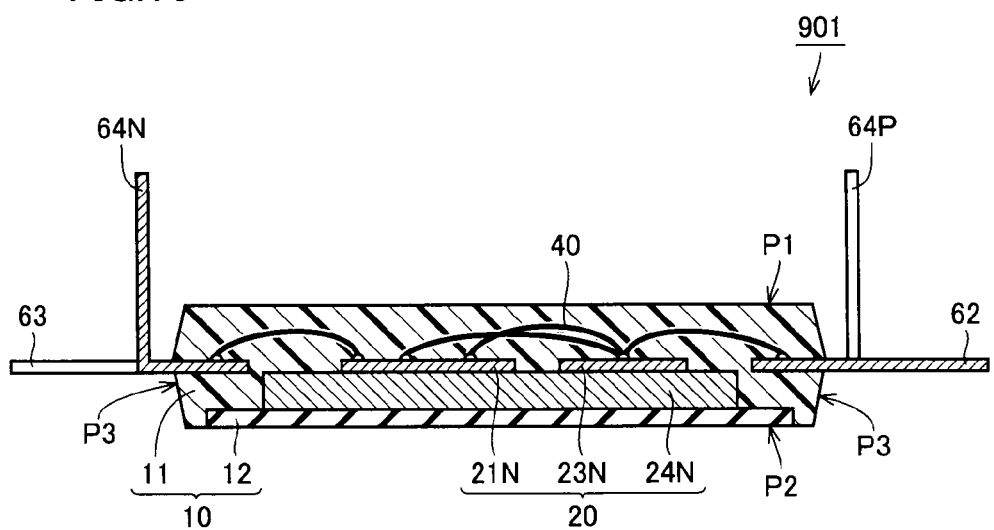
FIG. 16 is a schematic cross-sectional view along line XVI-XVI in each of FIGS. 14 and 15.

Next, a configuration of a power module as a semiconductor device in a comparative example is described using FIGS. 14-16.

Referring to FIGS. 14-16, a power module 901 of the comparative example is different from power module 101 in the first embodiment in that it does not have contact holes A1P and A1N and has control leads 64P and 64N instead. Control leads 64P and 64N protrude from the inside of encapsulation member 10 through third plane P3, similarly to leads 61-63. The protruding control leads 64P and 64N are each bent toward the first plane P1 side at right angles. Control leads 64P and 64N are connected to control pads 51P and 51N, respectively, by aluminum wires 40 inside encapsulation member 10.

Next, a configuration where a control substrate is added to power module 901 in the comparative example is described.

Figure 17:
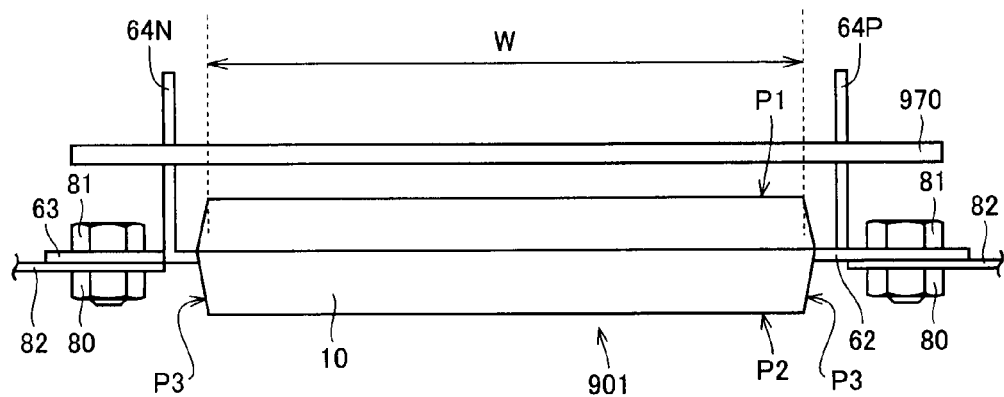
FIG. 17 is a schematic side view showing a state where a control substrate is added to the power module as the semiconductor device in the comparative example.

Referring mainly to FIG. 17, a control substrate 970 has a function of outputting a control signal. Control substrate 970 is arranged near first plane P1 in parallel therewith, and connected to each of control leads 64P and 64N.

Control leads 64P and 64N protrude from the inside of encapsulation member 10 through third plane P3, and then extend as bent in the direction perpendicular to first plane P1, toward control substrate 970. That is, between IGBT elements 21P and 21N and control substrate 970, electric connection is established so as to detour first plane P1. Accordingly, it is difficult to directly connect control substrate 970 and each of control leads 64P and 64N, unless the width of control substrate 970 is greater than width W of first plane P1.

According to the present embodiment, as shown in FIGS. 1-3, encapsulation member 10 has contact holes A1P and contact holes A1N respectively exposing control pads 51P and control pads 51N that are part of the surface of encapsulation-target portion 20 on the first plane P1 side. Accordingly, as shown in FIG. 8, even when the width of control substrate 70 is not greater than width W of first plane P1, control substrate 70 and power module 101 can be arranged so that control substrate 70 is opposed to each of contact holes A1P and A1N. Thus, electric connection between power module 101 and control substrate 70 can be established via first plane P1. Accordingly, as compared with the comparative example (FIG. 17) in which electric connection is established via third plane P3 and detouring first plane P1, electric connection can be established in a smaller space. As a result, the whole power module 101 with added control substrate 70 can be reduced in size.

Furthermore, contact holes A1P and contact holes A1N are positioned on IGBT element 21P and IGBT element 21N, respectively. Thus, electric connection between IGBT elements 21P, 21N and control substrate 70 can be established via first plane P1 on IGBT elements 21P and 21N of encapsulation member 10. Accordingly, as compared with the case where electric connection is established detouring first plane P1 on IGBT elements 21P and 21N of encapsulation member 10, electric connection is established in a smaller space. Therefore, reduction in size of the whole power module 101 with added control substrate 70 can be realized.

As shown in FIGS. 1-3, leads or wires are not formed on control pads 51P and 51N. Accordingly, control leads 64P and 64N, and aluminum wires 40 for control pads 51P and 51N as in the comparative example shown in FIGS. 14 and 15 are not necessary, whereby costs can be reduced.

As contact holes A1P and A1N have circular cross-sectional shape, stress concentration at part of the outer edge of contact holes A1P and A1N is suppressed, whereby the reliability of power module 101 can be maintained.

Control pads 51P and 51N of power module 101 before control substrate 70 is added are not provided with the portions that are electrically connected to control pads 51P and 51N and that are protruding from encapsulation member 10. Accordingly, electrostatic breakdown of IGBT elements 21P and 21N can be avoided. In the comparative example, control leads 64P and 64N protruding from encapsulation member 10 may contact an external element, whereby static electricity is applied to control pads 51P and 51N, causing electrostatic breakdown of IGBT elements 21P and 21N.

Encapsulation member 10 includes mold resin 11 made of a material having sufficient flowability in performing resin molding, on the first plane P1 side relative to encapsulation-target portion 20. Thus, encapsulation-target portion 20 can more surely be encapsulated.

Encapsulation member 10 includes insulating sheet 12 made of a material higher in thermal conductivity than the material of mold resin 11, on the second plane P2 side relative to encapsulation-target portion 20. Accordingly, heat from IGBT elements 21P and 21N and diode elements 23P and 23N can efficiently be dissipated to the outside of power module 101.

Power module 101 has heat spreader 24P between semiconductor elements 21P, 23P and insulating sheet 12, and has heat spreader 24N between semiconductor elements 21N, 23N and insulating sheet 12. Therefore, heat from semiconductor elements 21P, 21N, 23P and 23N is once diffused by heat spreaders 24P and 24N and then transmitted to insulating sheet 12. Thus, the heat can efficiently be dissipated from second plane P2 to the outside of power module 101.

Contact holes A1P and A1N are formed on the first plane P1 side. That is, they are formed on the side opposite to second plane P2 that serves as a major heat dissipating surface owing to the presence of heat spreaders 24P, 24N and insulating sheet 12. Accordingly, as shown in FIG. 8, when control substrate 70 is arranged on the side where contact holes A1P and A1N are formed, heat can be dissipated from the second plane P2 side without being blocked by control substrate 70.

Figure 57:
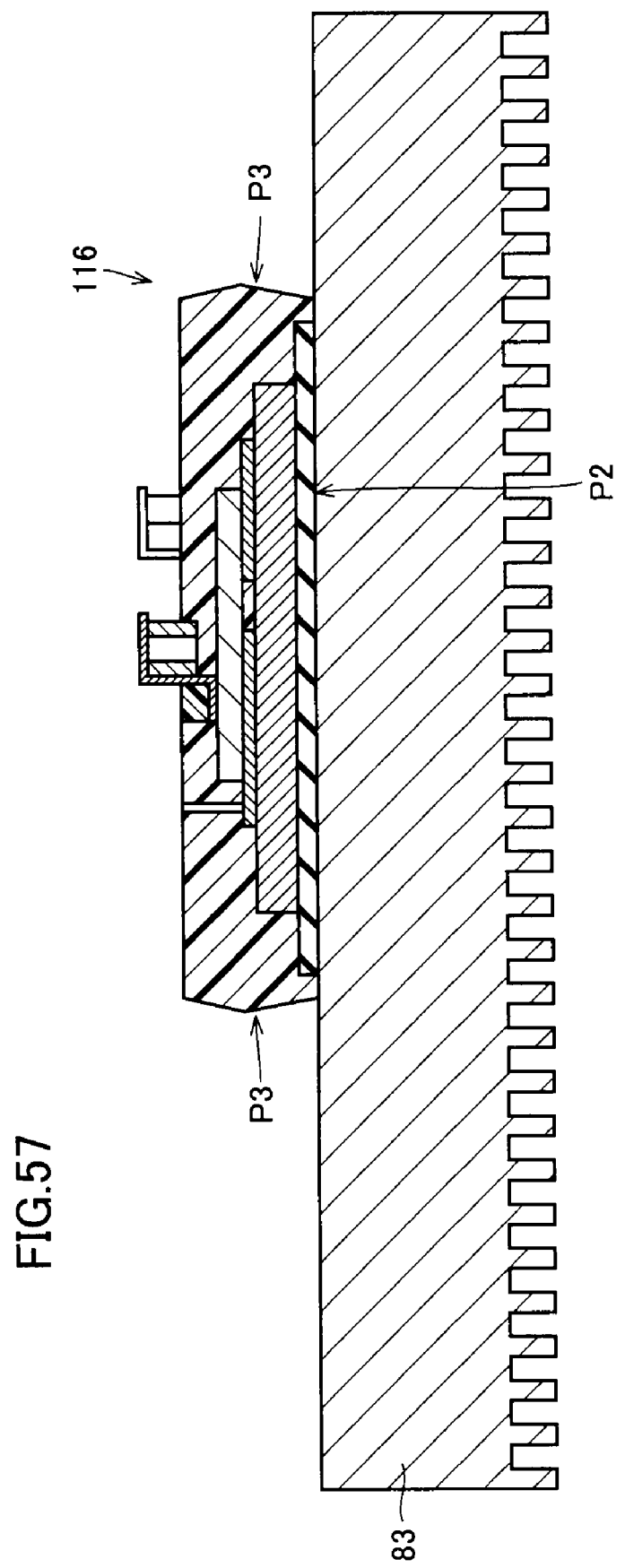
FIG. 57 is a cross-sectional view schematically showing a configuration where a heat dissipation fin is added to the power module as the semiconductor device in the sixteenth embodiment of the present invention.

Furthermore, a heat dissipation fin 83 as shown in FIG. 57 can be added on the second plane P2 side being the major heat dissipating surface, thereby further improving the heat dissipation efficiency.

As leads 61-63 protruding through third plane P3 are provided, as shown in FIG. 8, external structure 82 positioned near third plane P3 can be connected to power module 101 directly or with a short path.

Second Embodiment

Figure 19:
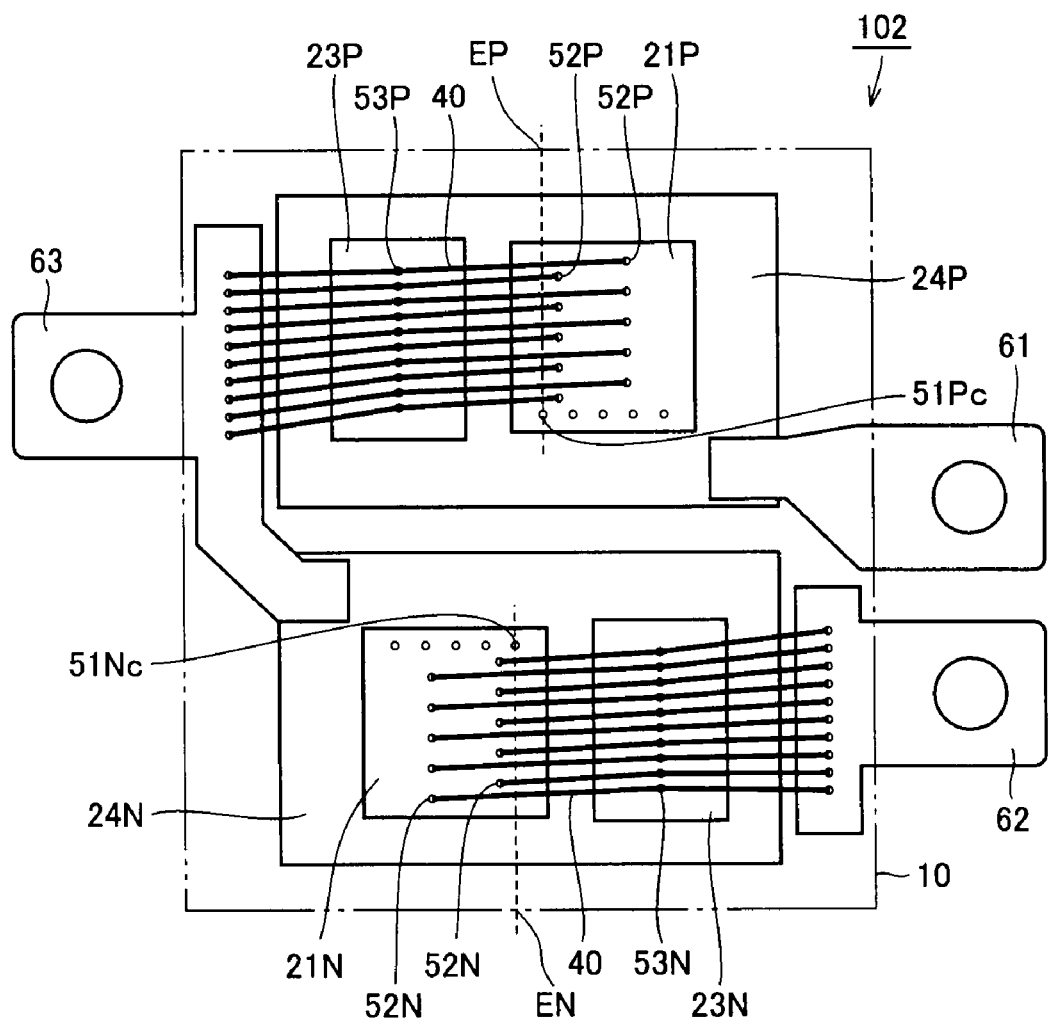

Referring to FIG. 19, IGBT element 21P and IGBT element 21N of a power module 102 in the present embodiment have control pads 51Pc and control pads 51Nc, respectively. In the plan view of power module 102 as in FIG. 19 as seen from the first plane P1 side, between control pads 51Pc, 51Nc and positions EP, EN, respectively, aluminum wires 40 are positioned, wherein positions EP and EN are positions on the outer edge (represented by a chain double-dashed line in the drawing) of encapsulation member 10 that are nearest to control pads 51Pc and 51Nc, respectively. This positional relationship can be attained by, instead of employing IGBT elements 21P and 21N (FIG. 19) suitable for the present embodiment, rotating each mounting direction of IGBT elements 21P and 21N (FIG. 2) in the first embodiment by 90° clockwise.

The remainder of the configuration is substantially the same as that in the first embodiment described above, and therefore the identical or corresponding elements are denoted by the identical reference characters and description thereof is not repeated.

Figure 18:
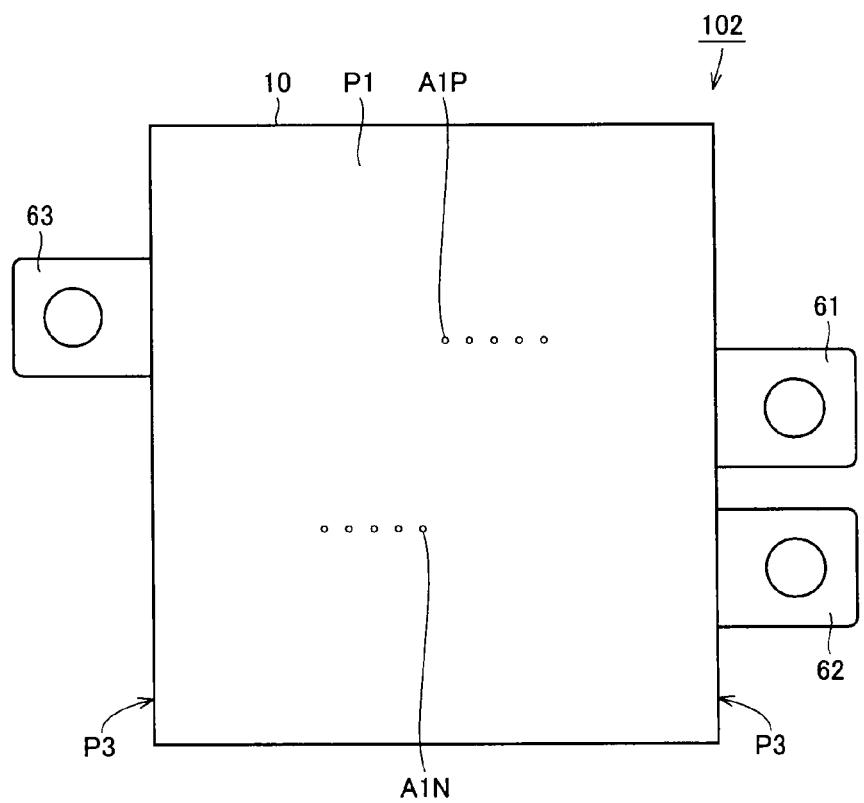
FIGS. 18 and 19 are plan views schematically showing a configuration of a power module as a semiconductor device in a second embodiment of the present invention.

According to the present embodiment, as shown in FIG. 19, control pads 51Pc and 51Nc can be formed closely to each other near the center portion of power module 102. Accordingly, even when control substrate 70 (FIG. 8) is smaller, control substrate 70 can be arranged to be opposed to each of contract holes A1P and A1N (FIG. 18) on control pads 51Pc and 51Nc, respectively. Accordingly, power module 102 with added control substrate 70 can further be reduced in size.

Between control pads 51Pc and 51Nc and positions EP and EN, respectively, aluminum wires 40 are positioned. Provided that electric paths (the paths along the broken line in the drawing) from control pads 51Pc and 51Nc toward the outer edge of encapsulation member 10 are formed, it is highly possible that short-circuiting occurs between the electric paths and aluminum wires 40. According to the present embodiment, electric paths from control pads 51Pc and 51Nc are provided via contact holes A1P and A1N, respectively. Therefore, the electric paths are provided to extend from control pads 51Pc and 51Nc, not toward the outer edge of encapsulation member 10, but toward first plane P1. Therefore, the above-described short-circuiting can be avoided.

Third Embodiment

Figure 20:
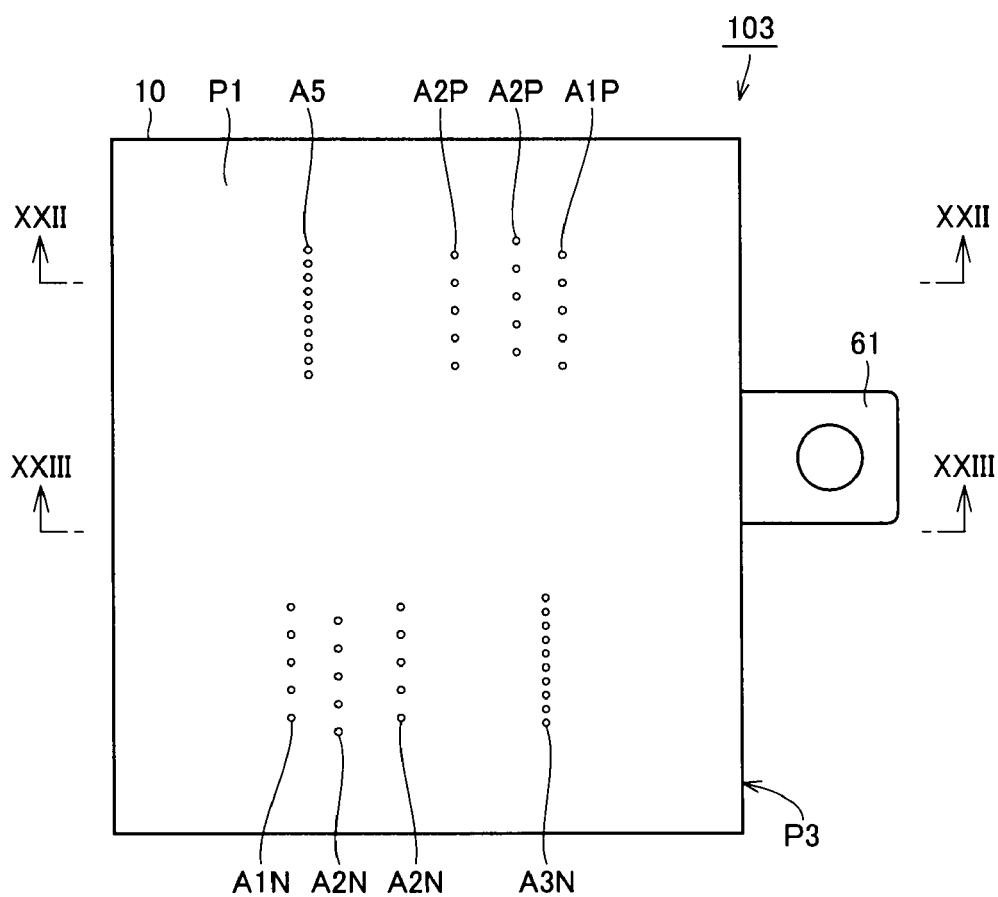
FIGS. 20 and 21 are plan views schematically showing a configuration of a power module as a semiconductor device in a third embodiment of the present invention.
Figure 21:
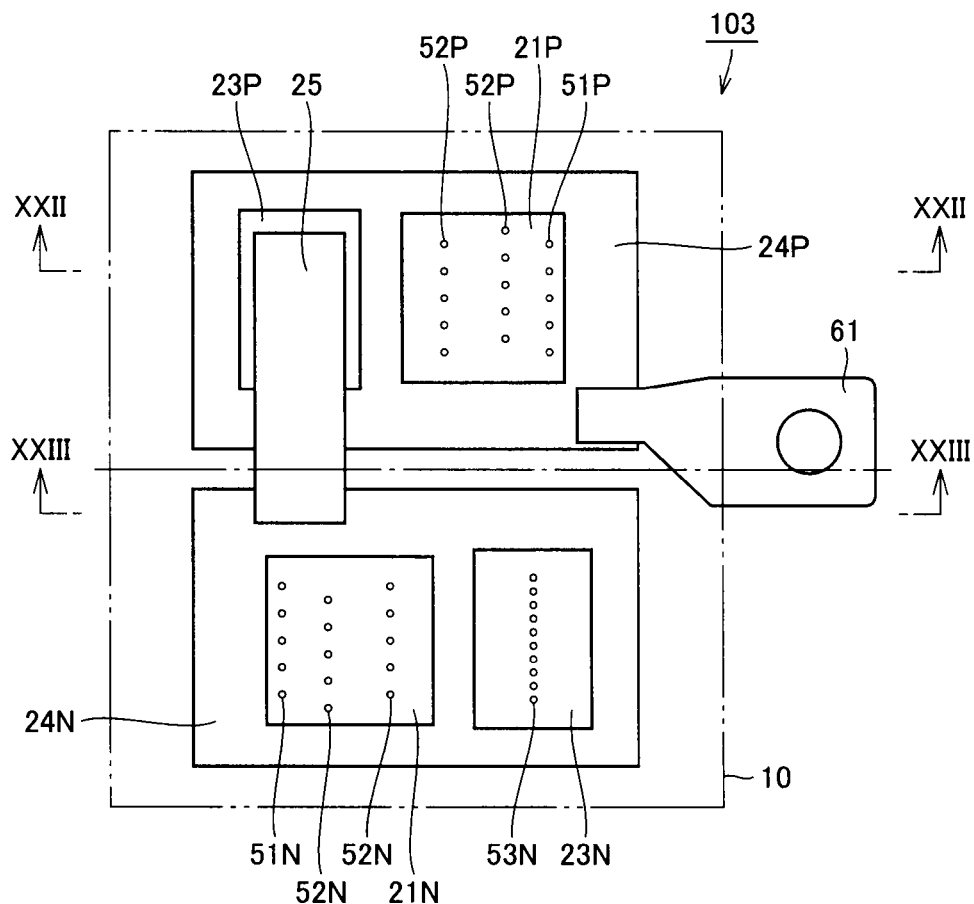
Figure 22:
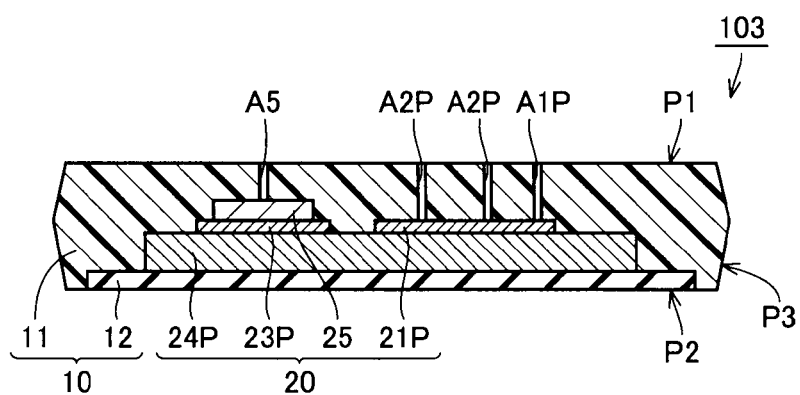
FIG. 22 is a schematic cross-sectional view along line XXII-XXII in each of FIGS. 20 and 21.
Figure 23:
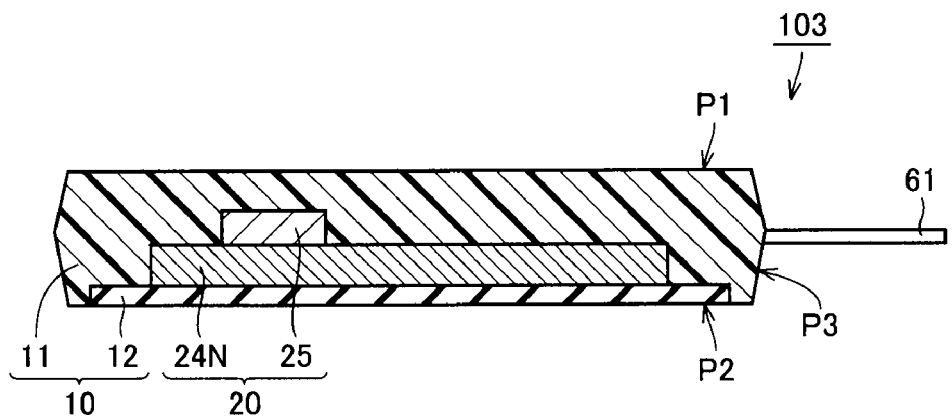
FIG. 23 is a schematic cross-sectional view along line XXIII-XXIII in each of FIGS. 20 and 21.

Referring to FIGS. 20 and 21, a power module 103 as a semiconductor device in the present embodiment is different from power module 101 in the first embodiment in that it has contact holes A2N and A3N instead of N lead 62 and has contact holes A2P and A5 instead of U lead 63.

Encapsulation-target portion 20 includes a frame 25 for electrically connecting diode element 23P to each of diode element 23N and IGBT element 21N, on diode element 23P and on the first plane P1 side. That is, encapsulation-target portion 20 includes frame 25 for electrically connecting at least a pair of semiconductor elements to each other. The serial connection of frame 25 and heat spreader 24N allows diode element 23P to be electrically connected to each of diode element 23N and IGBT element 21N.

Referring to FIGS. 4 and 20, power module 103 has a structure corresponding to circuit configuration S2, that is, the above-described "2 in 1" structure. Specifically, contact holes A2P and A5 correspond to output terminal U, and contact holes A2N and A3N correspond to input terminal N.

The remainder of the configuration is substantially the same as that in the first embodiment, and therefore the identical or corresponding elements are denoted by the identical characters and description thereof is not repeated.

According to the present embodiment, part of wiring in which frame 25 corresponds to circuit configuration S2 of what is called "2 in 1" can be configured.

Also, since electric connection from IGBT elements 21P and 21N and diode elements 23P and 23N can be established via contact holes A2N and A3N replacing N lead 62 (FIG. 1) and contact holes A2P and A5 replacing U lead 63 (FIG. 1), current loss can be suppressed as compared with the case where electric connection is established via aluminum wires 40 (FIG. 2) being thin wires.

Fourth Embodiment

Figure 24:
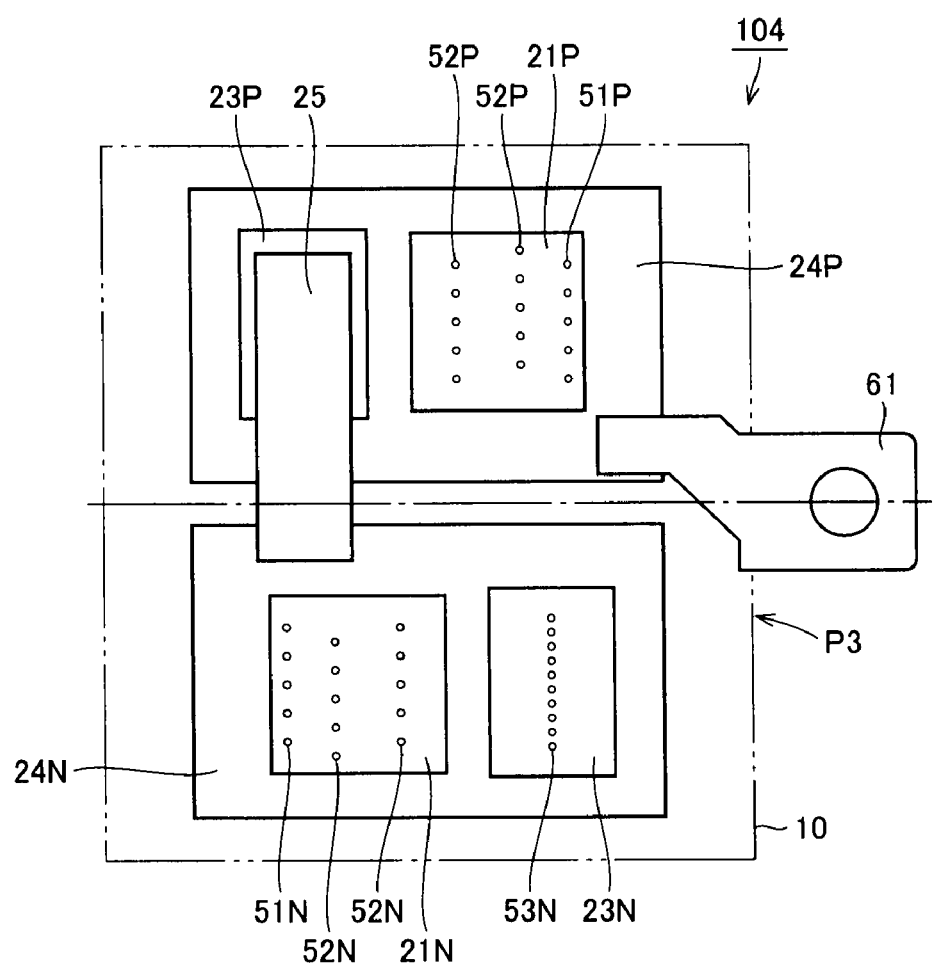
FIG. 24 is a plan view schematically showing a configuration of a power module as a semiconductor device in a fourth embodiment of the present invention.

Referring to FIG. 24, P lead 61 of a power module 104 as a semiconductor device in the present embodiment is provided at a position different than in power module 103 in the third embodiment. That is, in the plan view of power module 104 as in FIG. 24 as seen from the first plane P1 side, the outer edge (represented by a chain double-dashed line in the drawing) of encapsulation member 10 and a portion of P lead 61 protruding from third plane P3 share the same center line (represented by an alternate long and short dash line in the drawing).

The remainder of the configuration is substantially the same as that in the third embodiment described above, and therefore the identical or corresponding elements are denoted by the identical reference characters and description thereof is not repeated.

Figure 25:
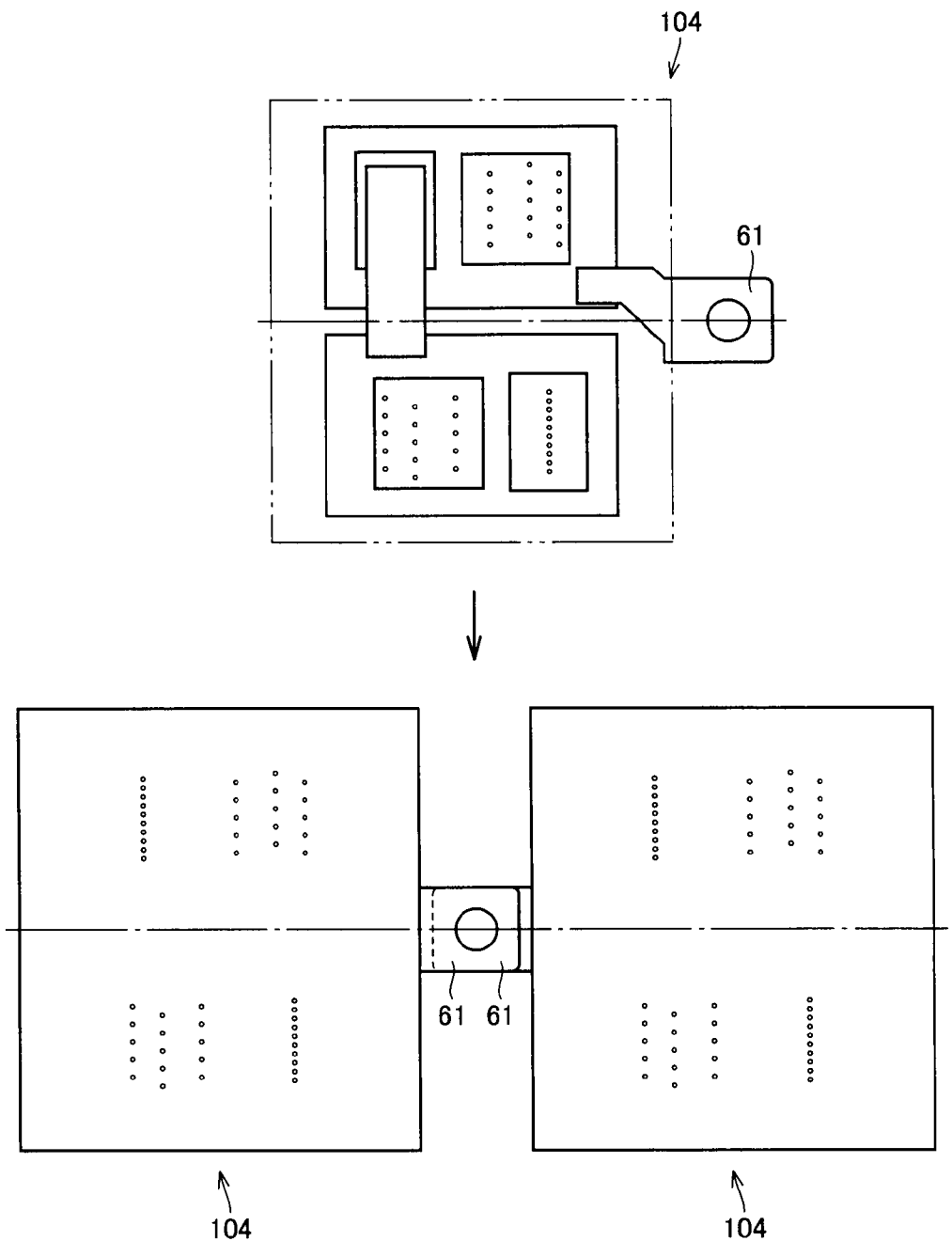
FIG. 25 is a plan view schematically showing a configuration where two power modules as the semiconductor devices in the fourth embodiment of the present invention are connected in parallel.

Referring to FIG. 25, two power modules 104 are arranged next to each other for addressing large current. P leads 61 are overlapped on each other so that their protruding tips contact each other. Two power modules 104 are arranged so that the center lines (represented by an alternate long and short dashed line in the drawing) of respective encapsulation members 10 match each other.

Figure 26:
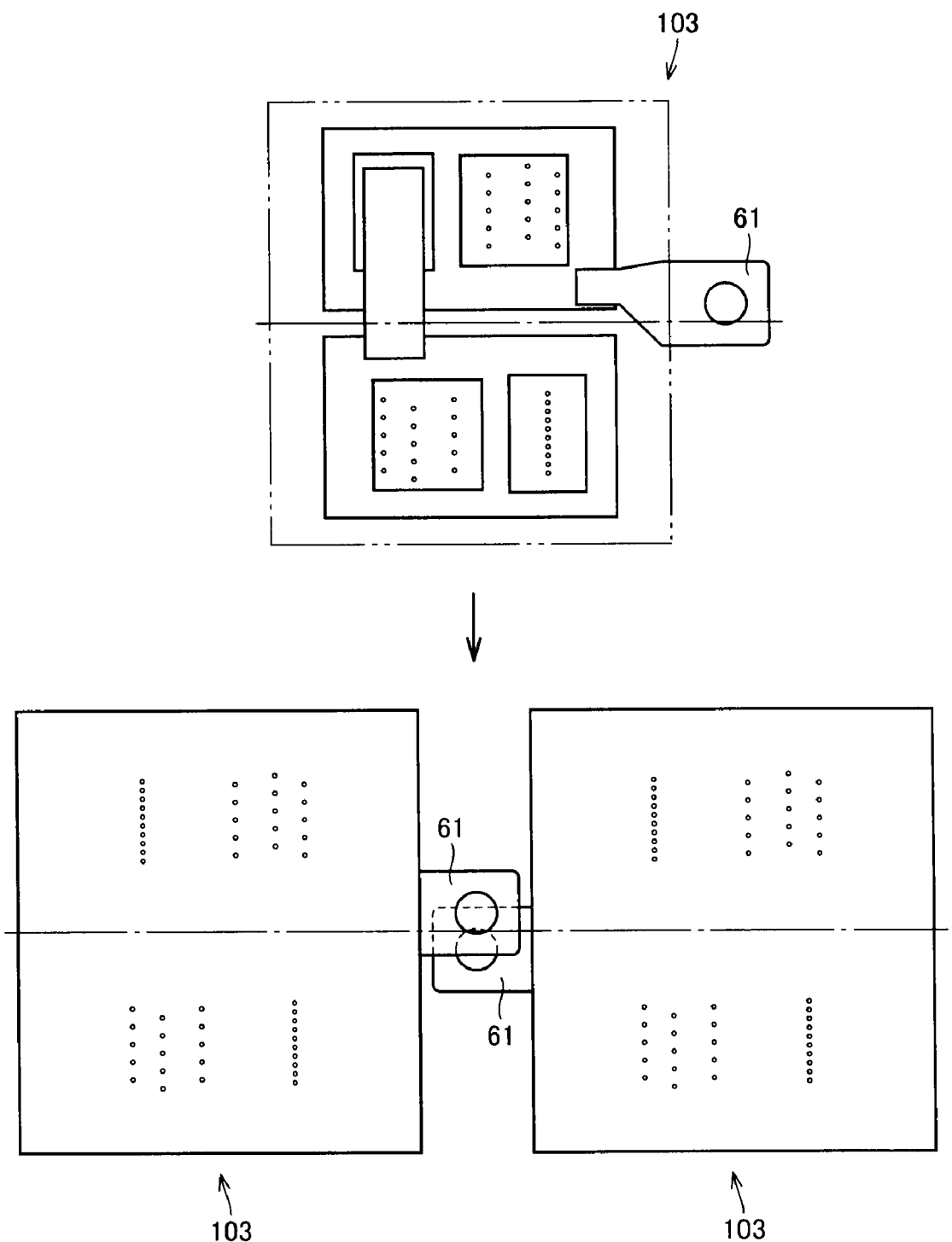
FIG. 26 is a plan view schematically showing a configuration where two power modules as the semiconductor devices in the comparative example are connected in parallel.

Referring to FIG. 26, when two power modules 103 (the power module in the third embodiment) are arranged so that the center lines (represented by an alternate long and short dash line in the drawing) of respective encapsulation members 10 match each other, the center lines (not shown) of respective P terminals 61 do not match. Thus, it is difficult to connect P terminals 61 to each other.

According to the present embodiment, when two power modules 104 are arranged as connected in parallel, they can be arranged so that the center lines of respective encapsulation members 10 match each other. Accordingly, two power modules 104 can be aligned along the shape of encapsulation members 10.

Fifth Embodiment

Figure 27:
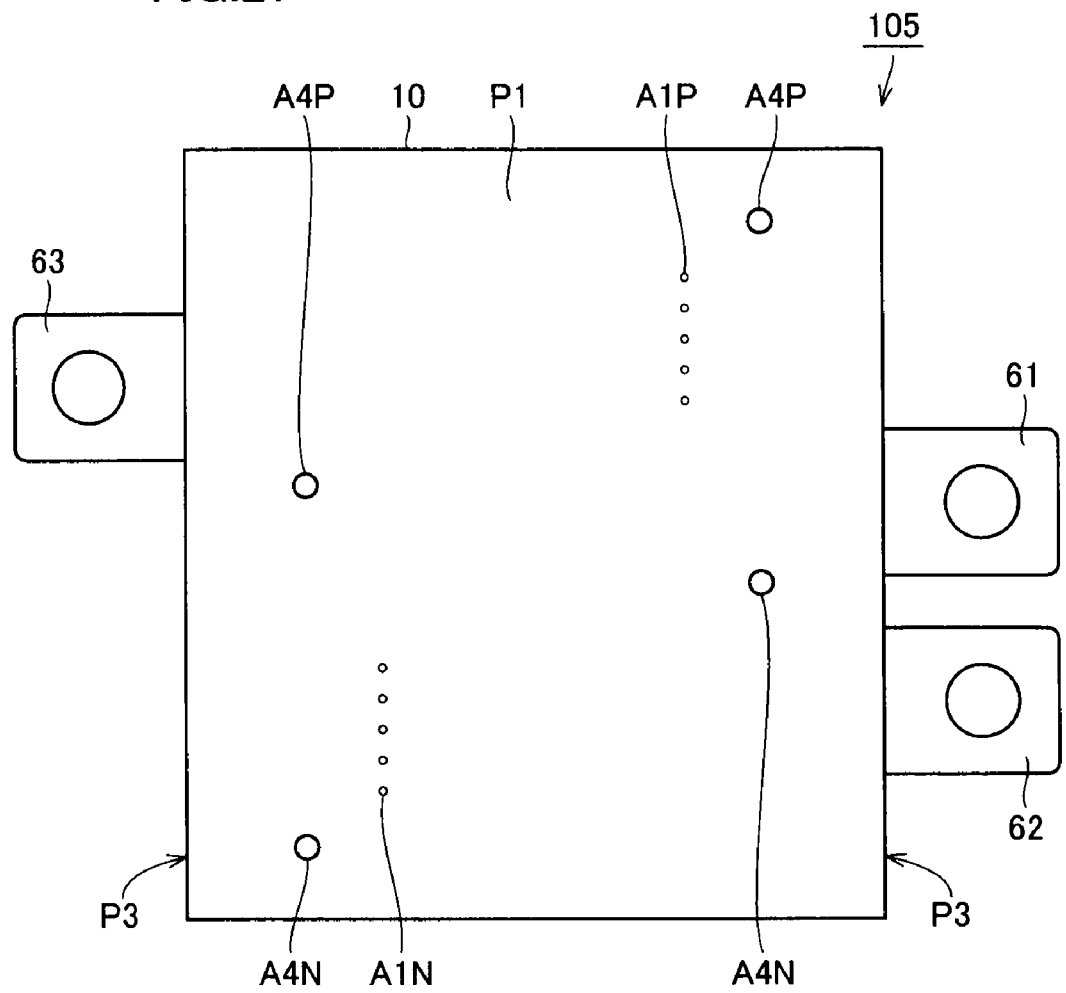
FIGS. 27 and 28 are plan views schematically showing a configuration of a power module as a semiconductor device in a fifth embodiment of the present invention.
Figure 28:
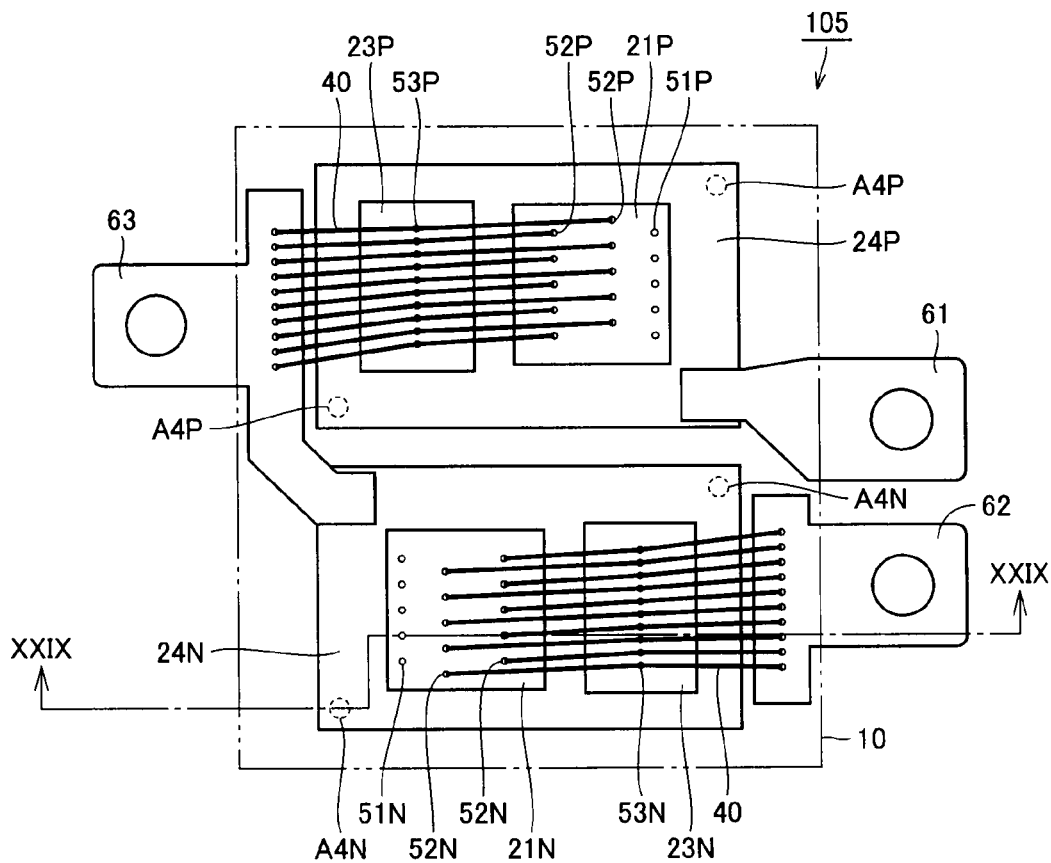
Figure 29:
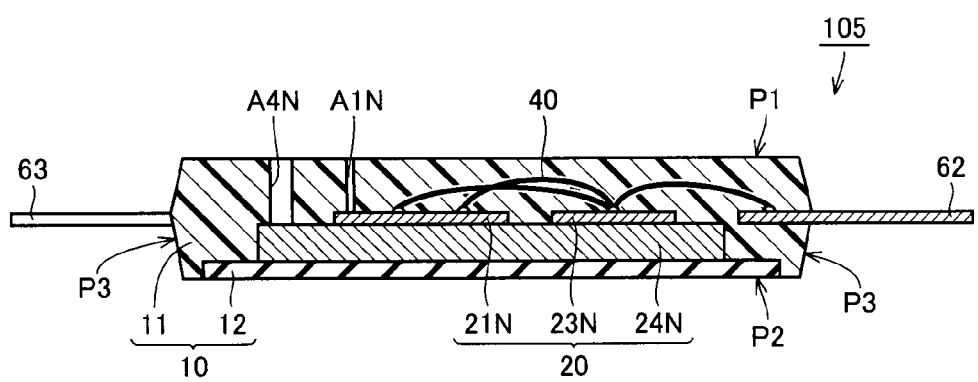
FIG. 29 is a schematic cross-sectional view along line XXIX-XXIX in FIG. 28.
Figure 30:
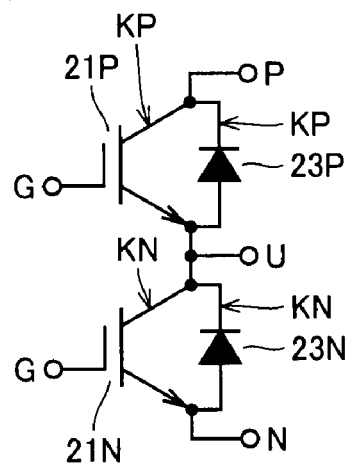
FIG. 30 schematically shows a circuit configuration of the power module as the semiconductor device in the fifth embodiment of the present invention.

Referring to FIGS. 27-29, encapsulation member 10 of a power module 105 as a semiconductor device in the present embodiment has contact holes A4P and contact holes A4N on heat spreader 24P and heat spreader 24N, respectively. Heat spreaders 24P and 24N have part of their respective surfaces on the first plane P1 side exposed by contact holes A4P and A4N, respectively.

Heat spreaders 24P and 24N each have a flat shape in a region being opposed to contact holes A4P and A4N, respectively, and each have an uneven shape on the surface being opposed to mold resin 11 for improving adhesion. The uneven shape has undulations that vary in a cycle smaller than the diameter of each of contact holes A4P and A4N.

Referring to FIGS. 27-30, electric connection from portions indicated by arrows KP and KN can be established via contact holes A4P and A4N, respectively.

The remainder of the configuration is substantially the same as that in the first embodiment described above, and therefore the identical or corresponding elements are denoted by the identical reference characters and description thereof is not repeated.

According to the present embodiment, since electric connection from portions indicated by arrows KP and KN can be established, by the four-terminal measurement (Kelvin sense) using this electric connection, true characteristics of semiconductor elements 21P, 21N, 23P and 23N can be evaluated more precisely.

Since the regions of heat spreaders 24P and 24N opposed to contact holes A4P and A4N, respectively, have a flat shape, workings for providing contact holes A4P and A4N can be performed as workings over a flat plane. Accordingly, the workings for providing contact holes A4P and A4N can be performed easily.

Since the regions of heat spreaders 24P and 24N opposed to contact holes A4P and A4N, respectively, have a flat shape, wiring members inserted into contact holes A4P and A4N for electric connection can easily be tightly connected to heat spreaders 24P and 24N, respectively.

Sixth Embodiment

Figure 31:
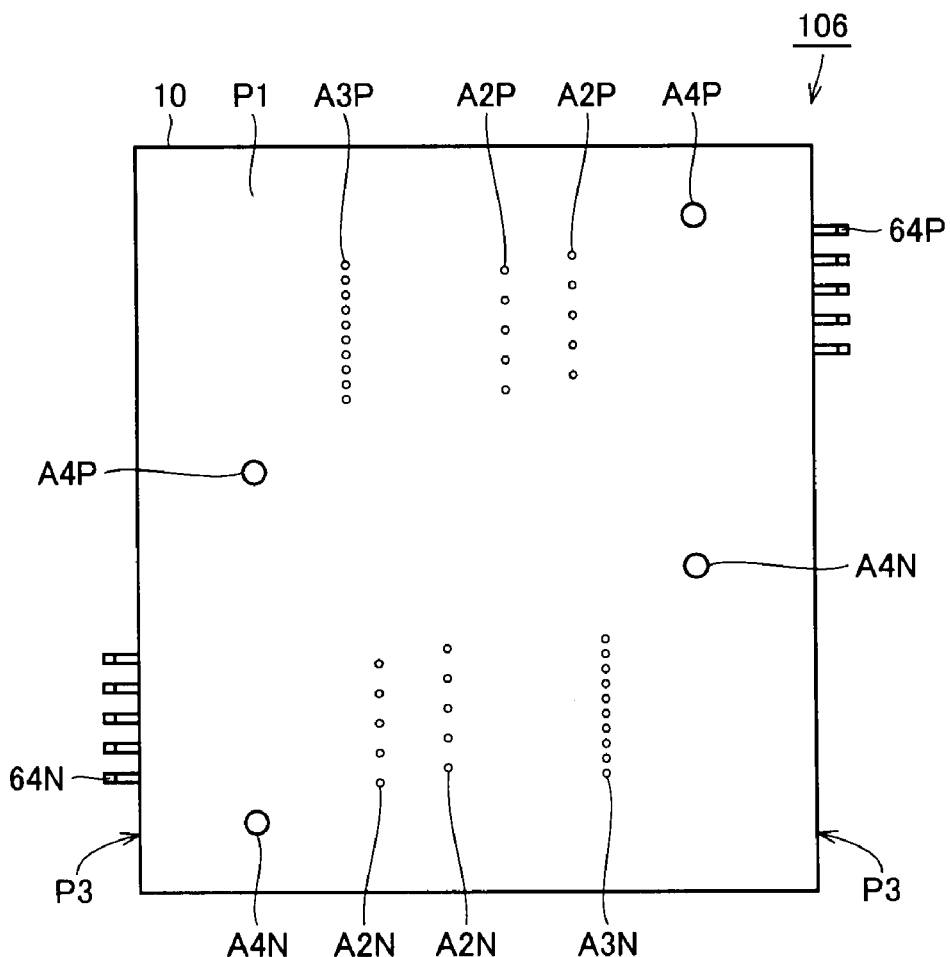
FIGS. 31 and 32 are plan views schematically showing a configuration of a power module as a semiconductor device in a sixth embodiment of the present invention.
Figure 32:
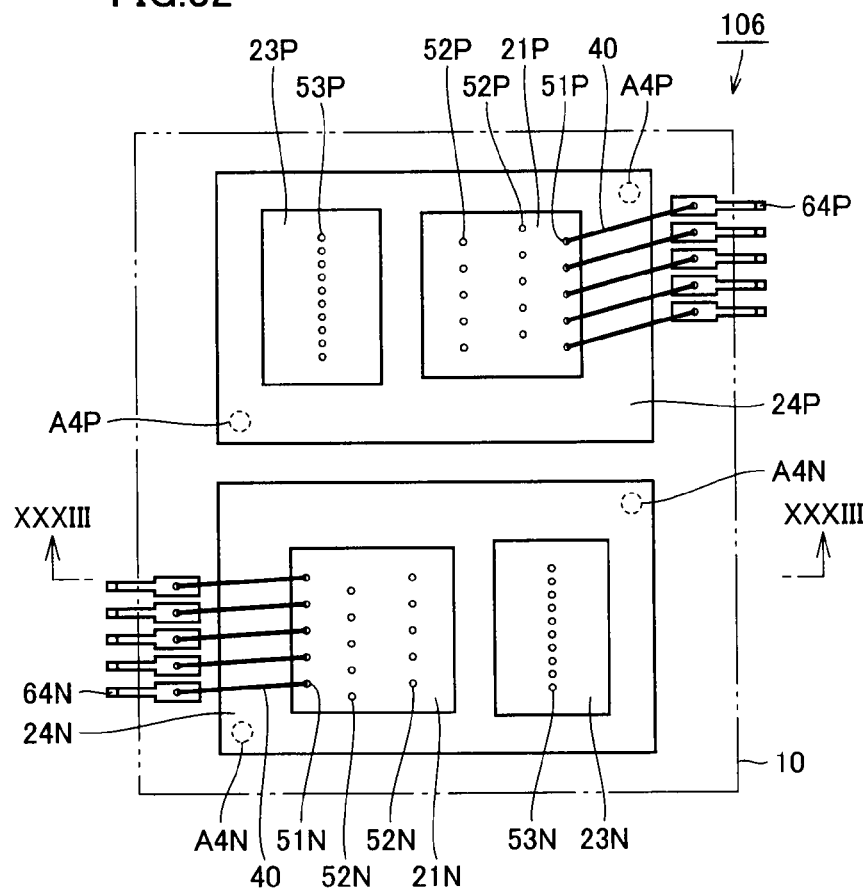
Figure 33:
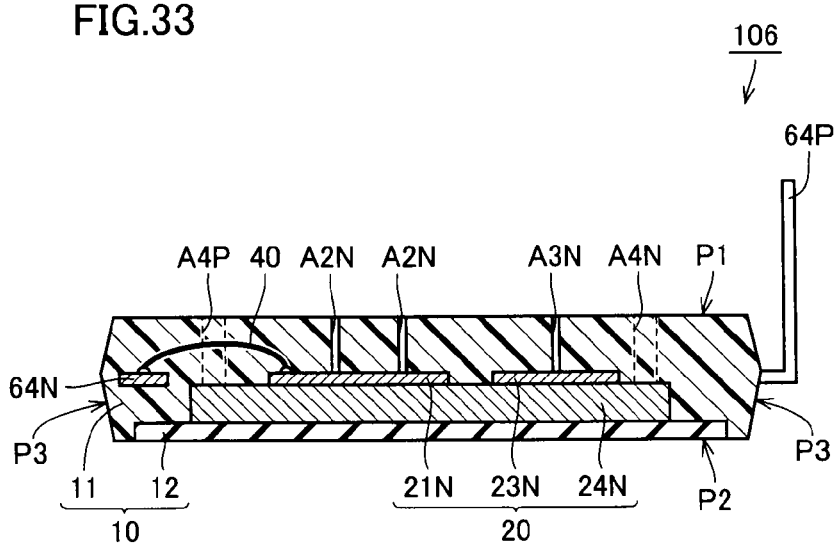
FIG. 33 is a schematic cross-sectional view along line XXXIII-XXXIII in FIG. 32.

Referring to FIGS. 31 and 32, a power module 106 as a semiconductor device in the present embodiment has IGBT elements 21P and 21N as semiconductor switching elements that switch electric paths passing through main terminals. IGBT element 21P and IGBT element 21N have emitter pads 52P and emitter pads 52N, respectively, as main terminals. IGBT element 21P and IGBT element 21N have control pads 51P and control pads 51N, respectively, as control terminals. As current passing through the control terminals corresponds to a control signal, it is relatively small current. On the other hand, since the main terminals are positioned in electric paths that are controlled by power module 106, current greater than in the control terminals passes therethrough.

Power module 106 is different from power module 101 in the first embodiment in that it has contact holes A2P, A2N, A3P, A3N, A4P and A4N instead of P lead 61, N lead 62 and U lead 63 (FIG. 2). Contact holes A2P, A2N, A3P, A3N, A4P, and A4N are provided on emitter pads 52P and 52N, diode pads 53P and 53N, and heat spreaders 24P and 24N, respectively. That is, contact holes A2P and A2N are positioned on the main terminals of the semiconductor switching elements.

Power module 106 is different from power module 101 in the first embodiment in that it has control leads 64P and 64N respectively connected to control pads 51P and 51N by aluminum wires 40, instead of contact holes A1P and A1N (FIG. 1). Control lead 64P and 64N each protrude from the inside of encapsulation member 10 through third plane P3 to the outside of power module 101.

The remainder of the configuration is substantially the same as that in the first embodiment described above, and therefore the identical or corresponding elements are denoted by the identical reference characters and description thereof is not repeated.

According to the present embodiment, power module 106 has contact holes A2P and A2N, instead of leads 61-63 (the first embodiment), for electric connection between main terminals. Accordingly, it is not necessary to form leads of large size for addressing great current passing through the main terminals, and therefore power module 106 can be reduced in size.

Seventh Embodiment

Figure 34:
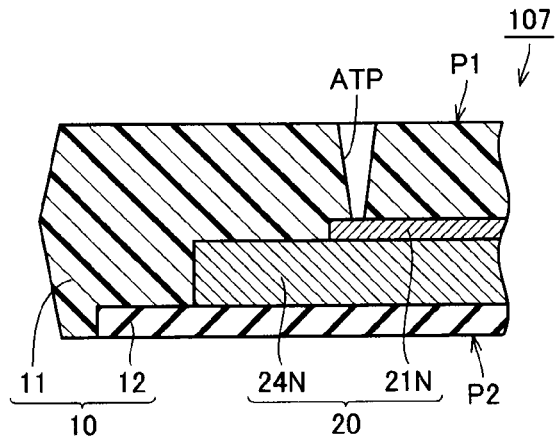
FIG. 34 is a partial cross-sectional view schematically showing a configuration of a power module as a semiconductor device in a seventh embodiment of the present invention.
Figure 35:
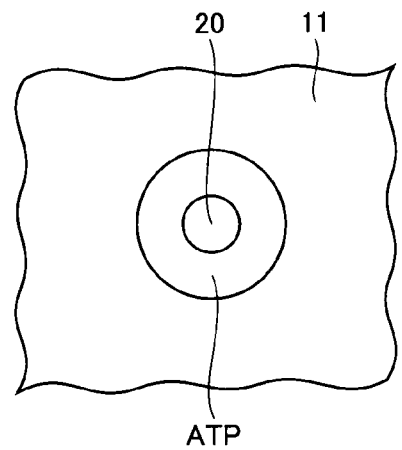
FIG. 35 is a schematic partial plan view of a portion around a contact hole in FIG. 34.

Referring to FIGS. 34 and 35, encapsulation member 10 of a power module 107 in the present embodiment has a contact hole ATP. Contact hole ATP is provided as, for example, contact hole A1N (FIG. 1) in the first embodiment. Contact hole ATP has a circular cross-sectional shape in parallel with first plane P1, and it is tapered so that the diameter of the circle is greater as nearer to first plane P1. That is, contact hole ATP has a cross-sectional shape, in parallel with first plane P1, of which area is greater as nearer to first plane P1.

While it has been described as to the case where contact hole ATP is provided as contact hole A1N (FIG. 1), any of contact holes A1P, A1N, A2P, A2N, A3P, A3N, A4P, A4N and A5 in the first to sixth embodiments can have the shape of ATP.

The remainder of the configuration is substantially the same as that in one of the first to sixth embodiments described above, and therefore the identical or corresponding elements are denoted by the identical reference characters and description thereof is not repeated.

According to the present embodiment, while suppressing the area by which IGBT elements 21P and 21N and diode elements 23P and 23N are exposed from encapsulation member 10, the opening area of contact hole ATP in first plane P1 can be increased. By the increased opening area, electric connection via contact hole ATP can easily be provided.

Eighth Embodiment

Figure 36:
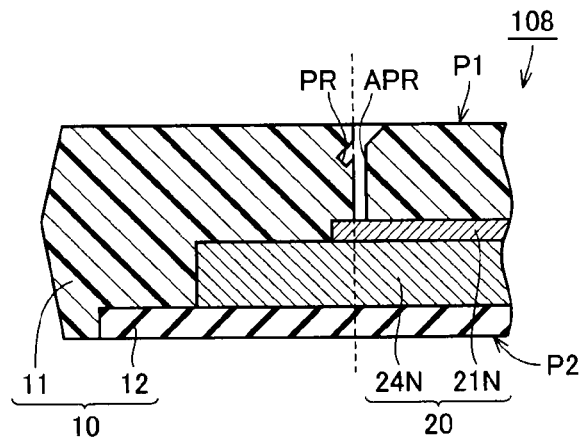
FIG. 36 is a partial cross-sectional view schematically showing a configuration of a power module as a semiconductor device in an eighth embodiment of the present invention.

Referring to FIG. 36, encapsulation member 10 of a power module 108 in the present embodiment has a contact hole APR. Contact hole APR is provided as, for example, contact hole A1N (FIG. 1) in the first embodiment.

On the side surface of contact hole APR, as part of the region of contact hole APR, a region where encapsulation member 10 is recessed is formed. That is, the side surface of contact hole APR has a protrusion PR protruding into encapsulation member 10.

Preferably, contact hole APR has a region similarly shaped as contact hole ATP in the seventh embodiment (FIGS. 34 and 35) and protrusion PR protruding from the side surface of that region into encapsulation member 10. That is, contact hole APR has: a taper region having a cross-sectional shape in parallel with first plane P1, the cross-sectional area being greater as nearer to first plane P1; and protrusion PR protruding from the side surface of the taper region into encapsulation member 10.

While it has been described as to the case where contact hole APR is provided as contact hole A1N (FIG. 1), any of contact holes A1P, A1N, A2P, A2N, A3P, A3N, A4P, A4N and A5 in the first to sixth embodiments can have the shape of ATP.

The remainder of the configuration is substantially the same as that of one of the first to sixth embodiments described above, and therefore the identical or corresponding elements are denoted by the identical reference characters and description thereof is not repeated.

According to the present embodiment, when contact hole APR is filled with a wiring member made of, for example, solder, the filled portion inside protrusion PR of contact hole APR serves as an anchor. That is, if force pulling the wiring member is exerted, it serves as an anchor to prevent the wiring member from being pulled out.

Additionally, as contact hole APR has the taper region, the same effect as in the seventh embodiment can be attained.

Ninth Embodiment

Figure 37:
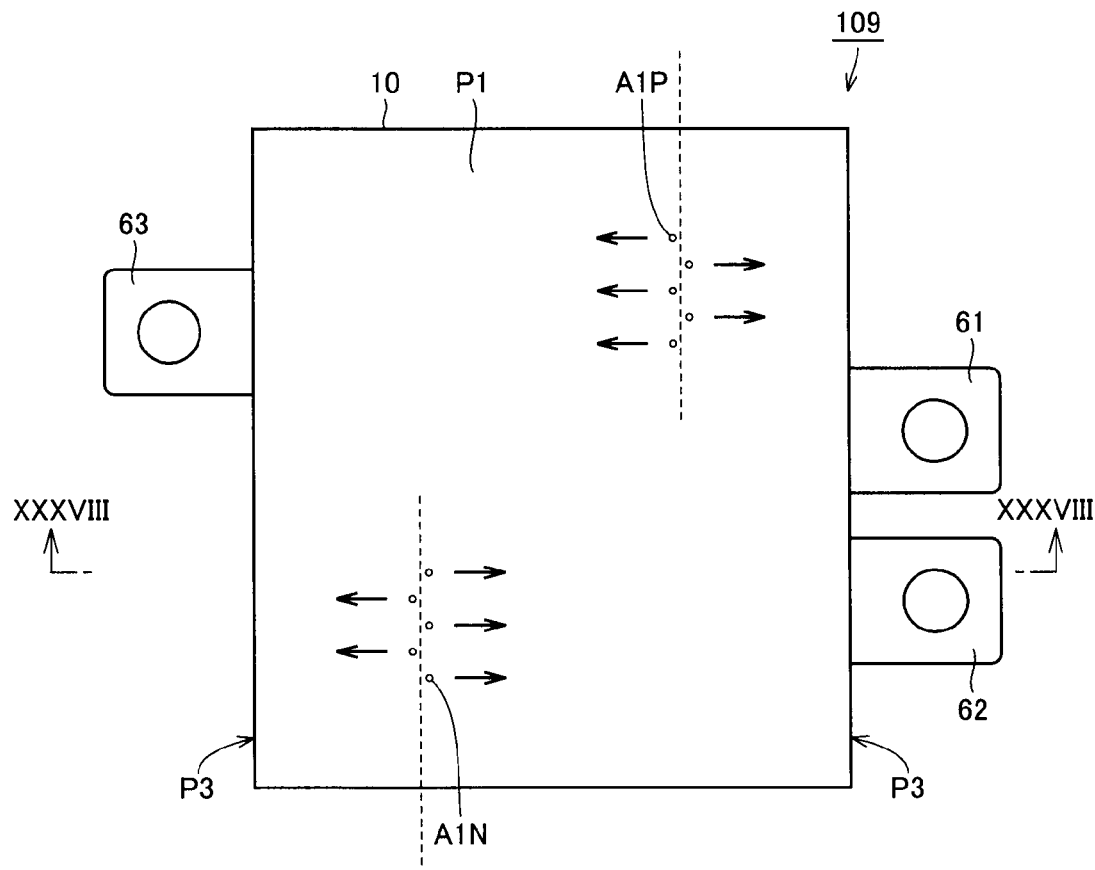
FIG. 37 is a plan view schematically showing a configuration of a power module as a semiconductor device in a ninth embodiment of the present invention.
Figure 38:
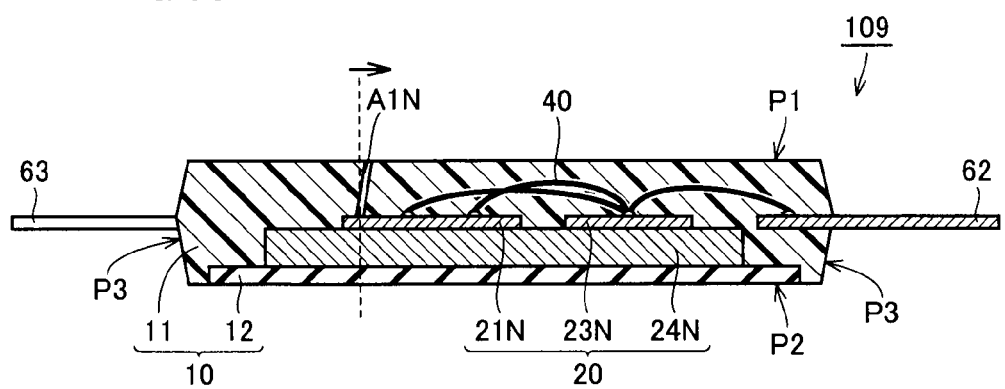
FIG. 38 is a schematic cross-sectional view along line XXXVIII-XXXVIII in FIG. 37.

Referring to FIGS. 37 and 38, a power module 109 as a semiconductor device in the present embodiment has a plurality of contact holes A1P and a plurality of contact holes A1N. The plurality of contact holes A1P and A1N are formed as tilted relative to the direction perpendicular to first plane P1 (indicated by the broken line in FIG. 38), so that adjacent holes, in each of plurality of contact holes A1P and A1N, are increasingly away from each other as they are nearer to first plane P1. Thus, the position of contact holes A1P and A1N of the present embodiment on first plane P1 is shifted toward the directions indicated by the arrows in the drawing relative to that in the first embodiment (the positions on the broken line in FIG. 37).

The remainder of the configuration is substantially the same as that in the first embodiment described above, and therefore the identical or corresponding elements are denoted by the identical reference characters and description thereof is not repeated.

According to the present embodiment, as compared to the case where all of the plurality of contact holes A1P and A1N are formed to extend in a direction perpendicular to first plane P1, adjacent holes in each of plurality of contact holes A1P and A1N can further be distanced from each other on first plane P. Accordingly, when the adjacent holes in each of plurality of contact holes A1P and A1N are each provided with wiring, an interference between them can be prevented.

Tenth Embodiment

Figure 39:
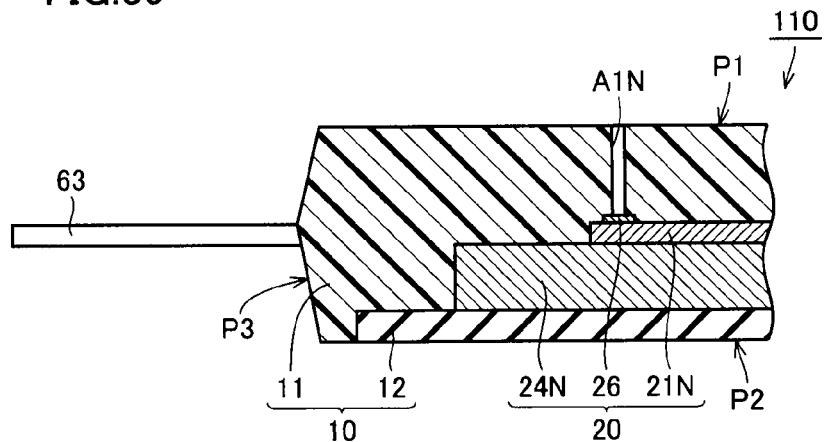
FIG. 39 is a cross-sectional view schematically showing a configuration of a power module as a semiconductor device in a tenth embodiment of the present invention.

Referring to FIG. 39, an encapsulation-target portion 20 of a power module 110 of a semiconductor device in the present embodiment includes a conductor portion 26 opposed to contact hole A1N. Conductor portion 26 is a metallization layer that IGBT element 21N has on control pad 51N (not shown in FIG. 39) or a block included in encapsulation-target portion 20.

The metallization layer is a conductor layer made of, for example, gold (Au) or silver (Ag). The block is a conductor block made of, for example, copper (Cu).

The remainder of the configuration is substantially the same as that in the first embodiment described above, and therefore the identical or corresponding elements are denoted by the identical reference characters and description thereof is not repeated.

According to the present embodiment, when forming contact hole A1N, or when establishing connection using contact hole A1N, damage applied to IGBT element 21N can be reduced by conductor portion 26.

By providing conductor portion 26 opposed to each of contact holes A1P, A1N, A2P, A2N, A3P, A3N, A4P, A4N and A5 in the first to sixth embodiments, damage applied to IGBT elements 21P, 21N, and diode elements 23P and 23N can be reduced.

Eleventh Embodiment

Figure 40:
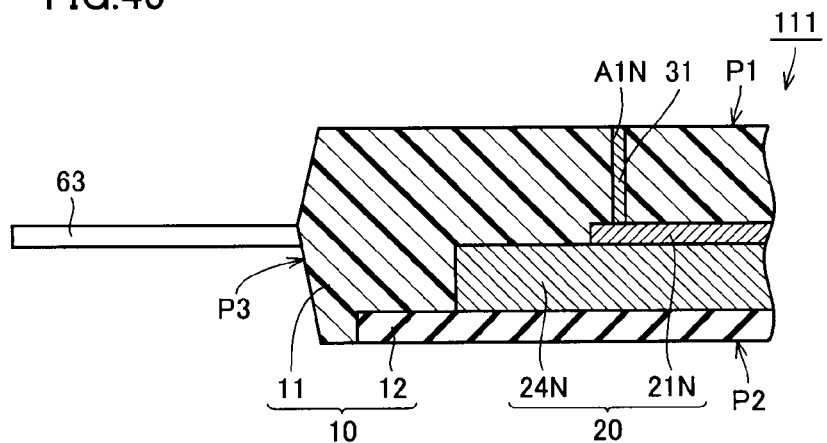
FIG. 40 is a cross-sectional view schematically showing a configuration of a power module as a semiconductor device in an eleventh embodiment of the present invention.

Referring to FIG. 40, contact hole A1N positioned on IGBT element 21N on a power module 111 as a semiconductor device in the present embodiment is filled with a filler portion 31 made of a conductor such as solder or conductive resin.

Preferably, the melting point of the conductor forming filler 31 is lower than that of the solder (not shown) connecting IGBT element 21N to heat spreader 24N.

Preferably, encapsulation-target portion 20 includes conductor portion 26 (not shown in FIG. 40) opposed to contact hole A1N as shown in FIG. 39.

The remainder of the configuration is substantially the same as that in the first embodiment described above, and therefore the identical or corresponding elements are denoted by the identical reference characters and description thereof is not repeated.

According to the present embodiment, by using filler portion 31 inside contact hole A1N as wiring, IGBT element 21N can easily be electrically connected to an element external to power module 111.

The melting point of the conductor forming filler portion 31 is lower than that of the solder connecting IGBT element 21N to heat spreader 24N. Thus, without allowing the solder connecting IGBT element 21N to heat spreader 24N to melt again, the conductor to be filler portion 31 is allowed to melt to form filler portion 31. Thus, reduction in the reliability of the connection between IGBT element 21N and heat spreader 24N can be suppressed.

As conductor portion 26 is provided between filler portion 31 and IGBT element 21N, filler portion 31 and IGBT element 21N can electrically be connected to each other further surely.

By each of contact holes A1P, A1N, A2P, A2N, A3P, A3N, A4P, A4N and A5 in the first to sixth embodiments being filled with filler portion 31, each of IGBT elements 21P, 21N and diode elements 23P and 23N can easily be electrically connected to an element external to power module 111.

Twelfth Embodiment

Figure 41:
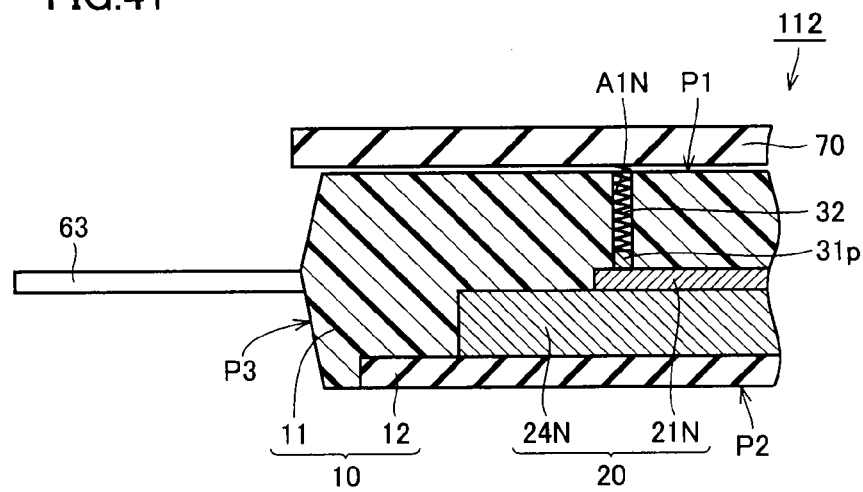
FIG. 41 is a cross-sectional view schematically showing a configuration of a power module as a semiconductor device in a twelfth embodiment of the present invention.

Referring to FIG. 41, a power module 112 as a semiconductor device in the present embodiment has a metal spring 32 and a control substrate 70.

Metal spring 32 is provided inside contact hole A1N so that it can elastically deform in the direction crossing first plane P1. That is, power module 112 has, inside contact hole A1N, a connection member made of a conductor that can elastically deform in the direction crossing first plane P1.

Control substrate 70 is positioned so as to cover contract hole A1N. Metal spring 32 is compressed between control substrate 70 and IGBT element 21N. Therefore, metal spring 32 has its one end pressed against the control substrate 70 side, and has its other end pressed against the IGBT element 21N side.

Preferably, as shown in FIG. 41, the second plane P2 side of contact hole A1N is filled with a filler portion 31p made of the same material as filler portion 31 in the eleventh embodiment, and the above-described metal spring 32 is provided on the first plane P1 side.

The remainder of the configuration is substantially the same as that in the eleventh embodiment described above, and therefore the identical or corresponding elements are denoted by the identical reference characters and description thereof is not repeated.

According to the present embodiment, control substrate 70 and IGBT element 21N are electrically connected to each other via metal spring 32. As insertion of metal spring 32 places itself inside contact hole A1N, electric connection between control substrate 70 and IGBT element 21N can easily be established.

As metal spring 32 can elastically deform, it can absorb force generated between IGBT element 21N and control substrate 70. Accordingly, the stress to power module 112 resulting from the force can be reduced, whereby the reliability of power module 112 is improved.

As filler portion 31p is provided between metal spring 32 and IGBT element 21N, stretching force of metal spring 32 is not directly applied to IGBT element 21N. Accordingly, damage to IGBT element 21N can be avoided.

Thirteenth Embodiment

Figure 42:
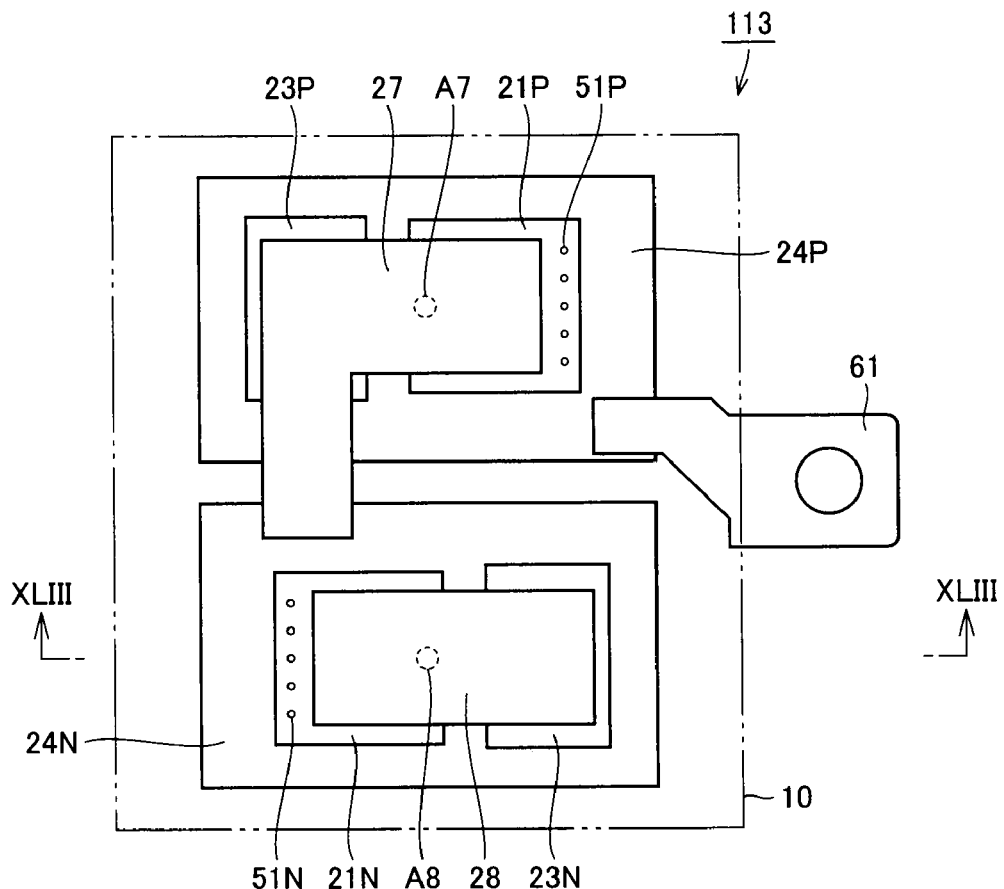
FIG. 42 is a plan view schematically showing a configuration of a power module as a semiconductor device in a thirteenth embodiment of the present invention.
Figure 43:
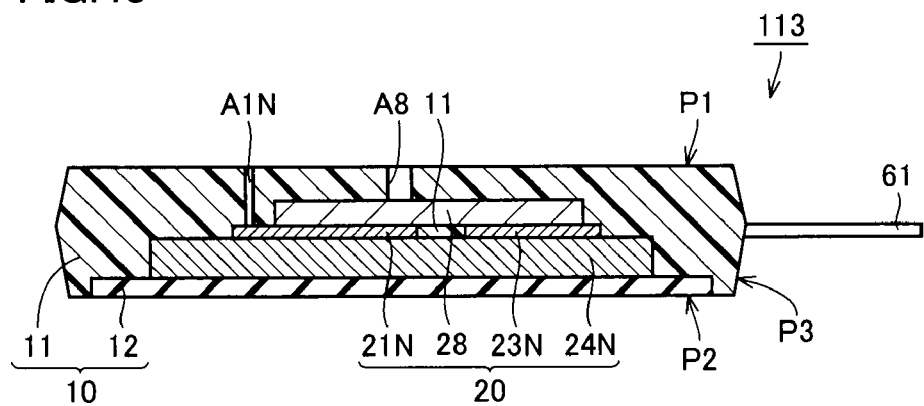
FIG. 43 is a schematic cross-sectional view along line XLIII-XLIII in FIG. 42.

Referring to FIGS. 42 and 43, a power module 113 as a semiconductor device in the present embodiment is different from power module 101 in the first embodiment in that it has contact holes A8 and A7 instead of P lead 62 and U lead 63, respectively.

Encapsulation-target portion 20 of power module 113 has one pair of IGBT element 21P and diode element 23P, and the other pair of IGBT element 21N and diode element 23N.

Encapsulation-target portion 20 has frames 27 and 28. Frame 27 is positioned on the one pair and on the first plane P1 side. Frame 28 is positioned on the other pair and on the first plane P1 side. Frame 27 electrically connects the one pair to each other. Frame 27 also has a function of electrically connecting the one pair to heat spreader 24N. Frame 28 electrically connects the other pair to each other.

Encapsulation member 10 has contact holes A7 and A8. Frames 27 and 28 have part of their surfaces on the first plane P1 side exposed by contact holes A7 and A8, respectively. Contact hole A7 is provided, with frame 27 interposed, on IGBT element 21P and diode element 23P of the one pair. Contact hole A8 is provided, with frame 28 interposed, on IGBT element 21N and diode element 23N of the other pair.

The remainder of the configuration is substantially the same as that in the first embodiment described above, and therefore the identical or corresponding elements are denoted by the identical reference characters and description thereof is not repeated.

According to the present embodiment, contact hole A7 is formed, with frame 27 interposed, on IGBT element 21P and diode element 23P. Contact hole A8 is formed, with frame 28 interposed, on IGBT element 21N and diode element 23N. Accordingly, as compared with the case where a contact hole is formed on IGBT element 21P/21N and diode elements 23P/23N without frame 27/28 being interposed, damage to IGBT elements 21P, 21N, and diode elements 23P, 23N can be reduced.

Contact hole A7 is used as an electric path to both of IGBT element 21P and diode element 23P paired by frame 27. Contact hole A9 is used as an electric path to both of IGBT element 21N and diode element 23N paired by frame 28. Accordingly, as compared with the case where a contact hole is formed for each of semiconductor elements 21P, 21N, 23P, and 23N, the number of contact holes can be reduced.

Fourteenth Embodiment

Figure 44:
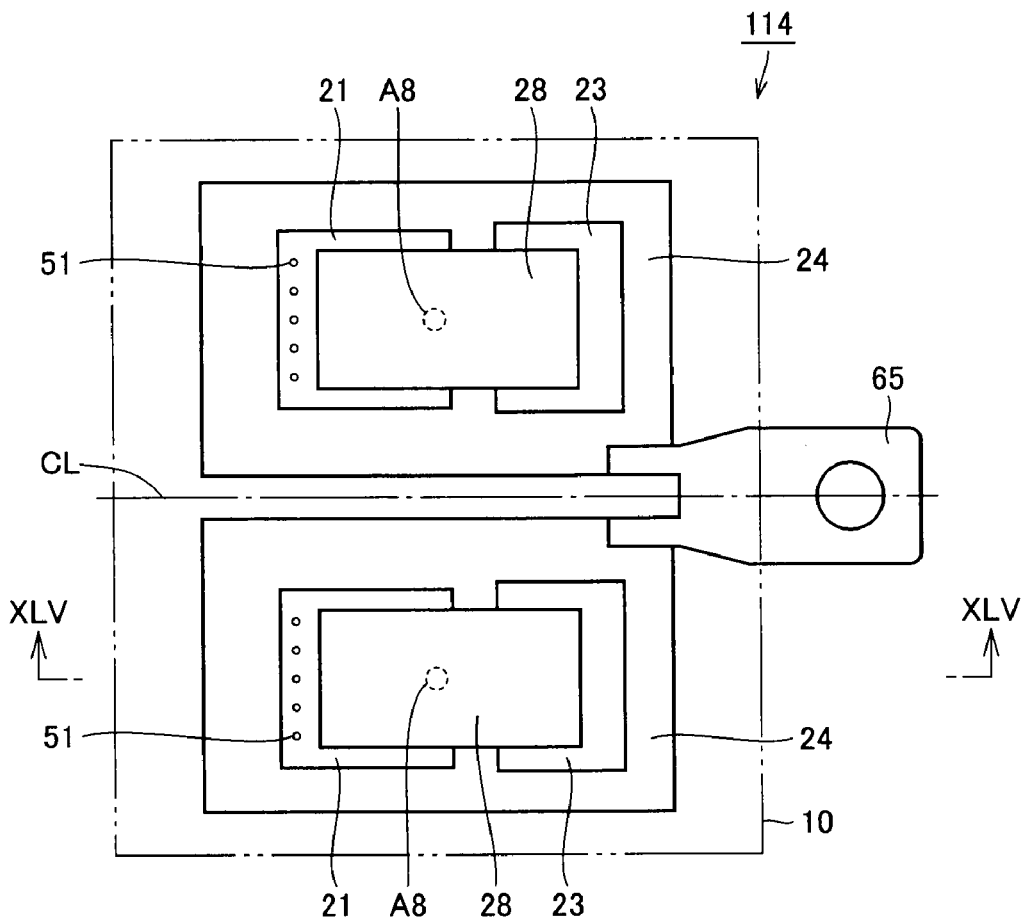
FIG. 44 is a plan view schematically showing a configuration of a power module as a semiconductor device in a fourteenth embodiment of the present invention.
Figure 45:
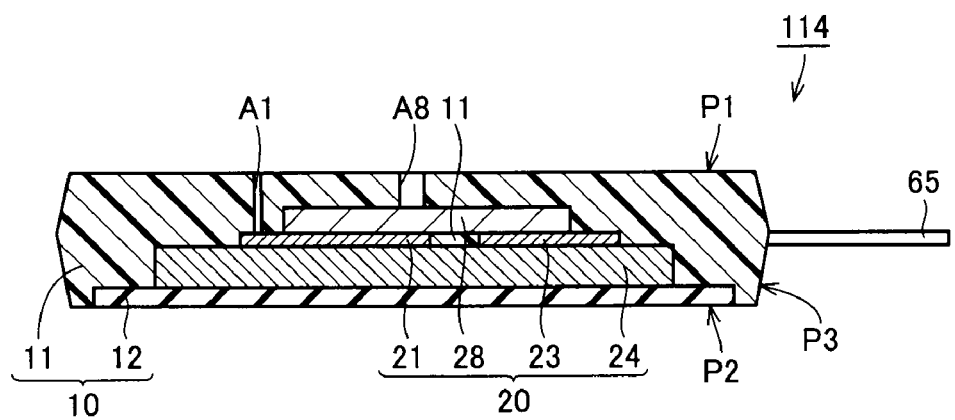
FIG. 45 is a schematic cross-sectional view along line XLV-XLV in FIG. 44.

First, a configuration of a power module as a semiconductor device in the present embodiment is described using FIGS. 44 and 45.

Referring to FIGS. 44 and 45, a power module 114 as the semiconductor device in the present embodiment includes encapsulation-target portion 20, encapsulation member 10, and lead 65.

Encapsulation-target portion 20 includes two heat spreaders 24, as well as IGBT element 21, diode element 23 and frame 28 provided on each of heat spreaders 24.

Each IGBT element 21 has a main terminal and a control terminal constituted of control pad 51. Each diode element 23 has a main terminal. Each frame 28 is positioned on IGBT element 21 and diode element 23 and on the first plane P1 side, to electrically connect the main terminal of IGBT element 21 and the main terminal of diode element 23 to each other. Each heat spreader 24 is positioned on the second plane P2 side relative to IGBT element 21 and diode element 23.

Lead 65 protrudes from inside encapsulation member 10 through third plane P3, and electrically connects two heat spreaders 24 to each other in encapsulation member 10. In the plan view of power module 114 as in FIG. 44 as seen from the first plane P1 side, the outer edge (represented by a chain double-dashed line in the drawing) of encapsulation member 10 and a portion of lead 65 protruding from third plane P3 share the same center line (represented by an alternate long and short dashed line CL in the drawing).

Encapsulation member 10 has a plurality of contact holes A8 and A1. Each contact hole A8 is provided, with frame 28 interposed, on IGBT element 21 and diode element 23. Each contact hole A1 is provided on control pad 51.

Figure 46:
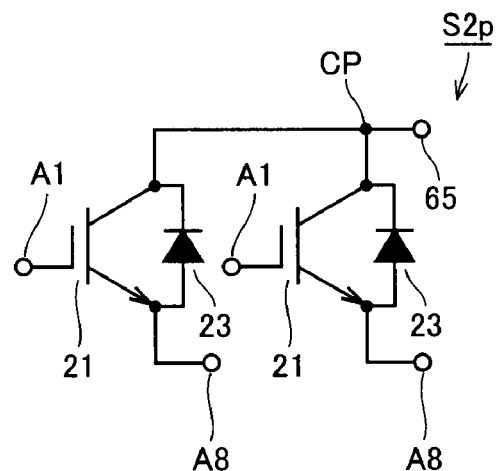
FIG. 46 schematically shows a circuit configuration of the power module as the semiconductor device in the fourteenth embodiment of the present invention.

Referring mainly to FIG. 46, power module 114 has a circuit configuration S2p in which circuit configurations S1 (FIG. 5) are connected at connection point CP and arranged in parallel.

Next, a configuration in which control substrate 70 is added to power module 114 in the present embodiment is described.

Figure 47:
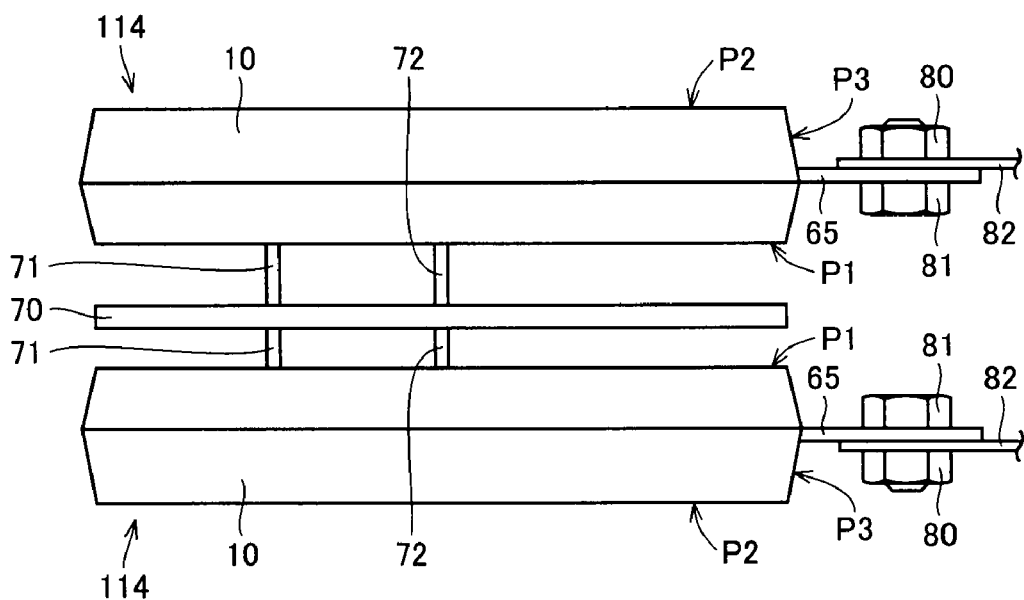
FIG. 47 is a schematic side view showing a state where a control substrate is added to the power module as the semiconductor device in the fourteenth embodiment of the present invention.

Referring mainly to FIG. 47, control substrate 70 is arranged as being interposed between respective first planes P1 of two power modules 114. Control substrate 70 has a control signal pin 71 and an emitter pin 72. Lead 65 of each power module 114 is connected to external structure 82 by screw 81 and nut 80.

Control substrate 70 has control signal pin 71 used for electric connection via contact hole A1 (FIG. 45) of each power module 114. Control substrate 70 has emitter pin 72 used for an electric connection via contact hole A8 (FIGS. 44 and 45) of each power module 114.

The remainder of the configuration is substantially the same as that in the first embodiment described above, and therefore the identical or corresponding elements are denoted by the identical reference characters and description thereof is not repeated.

According to the present embodiment, as shown in FIG. 46, the electric path from lead 65 is branched at connection point CP and connected to each IGBT element 21. Therefore, as compared with the case where such branch is not provided, greater current can be passed through power module 114.

As the outer shape of mold resin 11 can be formed in the shape similarly to those in the first to thirteenth embodiments, the mold for mold resin 11 in the first to thirteenth embodiments can be employed in the present embodiment. It is to be noted that, in order to address the greater current without a branch such as connection point CP, it is necessary to increase the cross-sectional area of the electric path in encapsulation member 10 for ensuring the reliability. It necessitates a separate mold for mold resin 11 that addresses the electric path with the increased cross-sectional area.

As shown in FIG. 44, in the plan view as seen from the first plane P1 side, the outer edge of encapsulation member 10 and the portion of lead 65 protruding from third plane P3 share the same center line CL. Thus, when two power modules 114 are arranged such that respective first planes P1 are opposed to each other, two power modules 114 can be aligned along the shape of encapsulation member 10.

Fifteenth Embodiment

Figure 48:
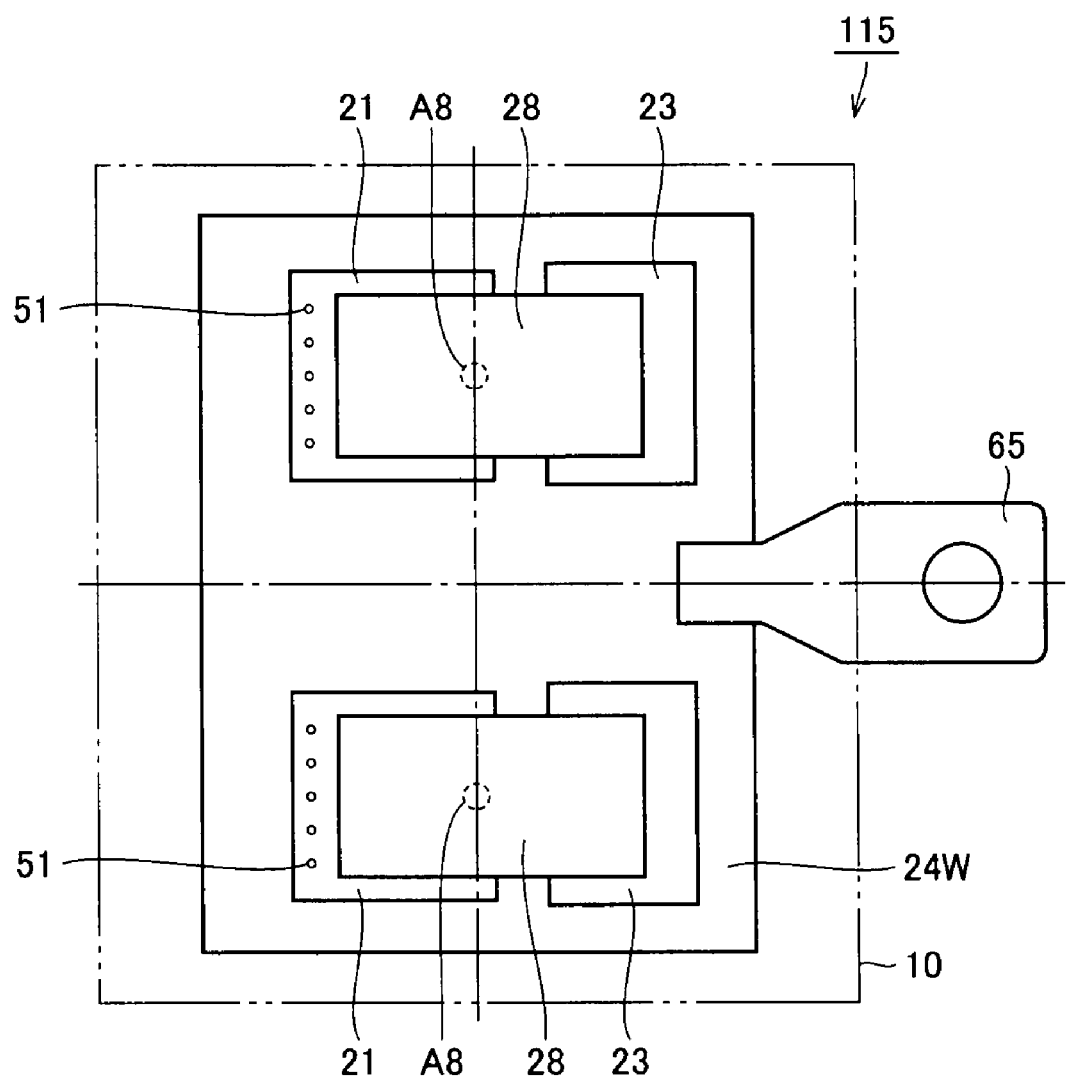
FIG. 48 is a plan view schematically showing a configuration of a power module as a semiconductor device in a fifteenth embodiment of the present invention. An encapsulation member is shown only by its outer edge.

Referring to FIG. 48, a power module 115 as a semiconductor device in the present embodiment includes a heat spreader 24W, which is two heat spreaders 24 in the fourteenth embodiment integrated with each other. That is, a plurality of IGBT elements 21 are provided on heat spreader 24W so that collector terminals being respective main terminals of plurality of IGBT elements 21 are electrically connected to each other via heat spreader 24W.

The remainder of the configuration is substantially the same as that in the fourteenth embodiment described above, and therefore the identical or corresponding elements are denoted by the identical reference characters and description thereof is not repeated.

According to the present embodiment, as integrated heat spreader 24W is employed, heat spreader 24W can connect a plurality of IGBT elements 21 to each other. Accordingly, a separate dedicated structure for connecting IGBT elements 21 to each other is not necessary, whereby reduction in size and costs of power module 115 is realized.

Sixteenth Embodiment

Figure 49:
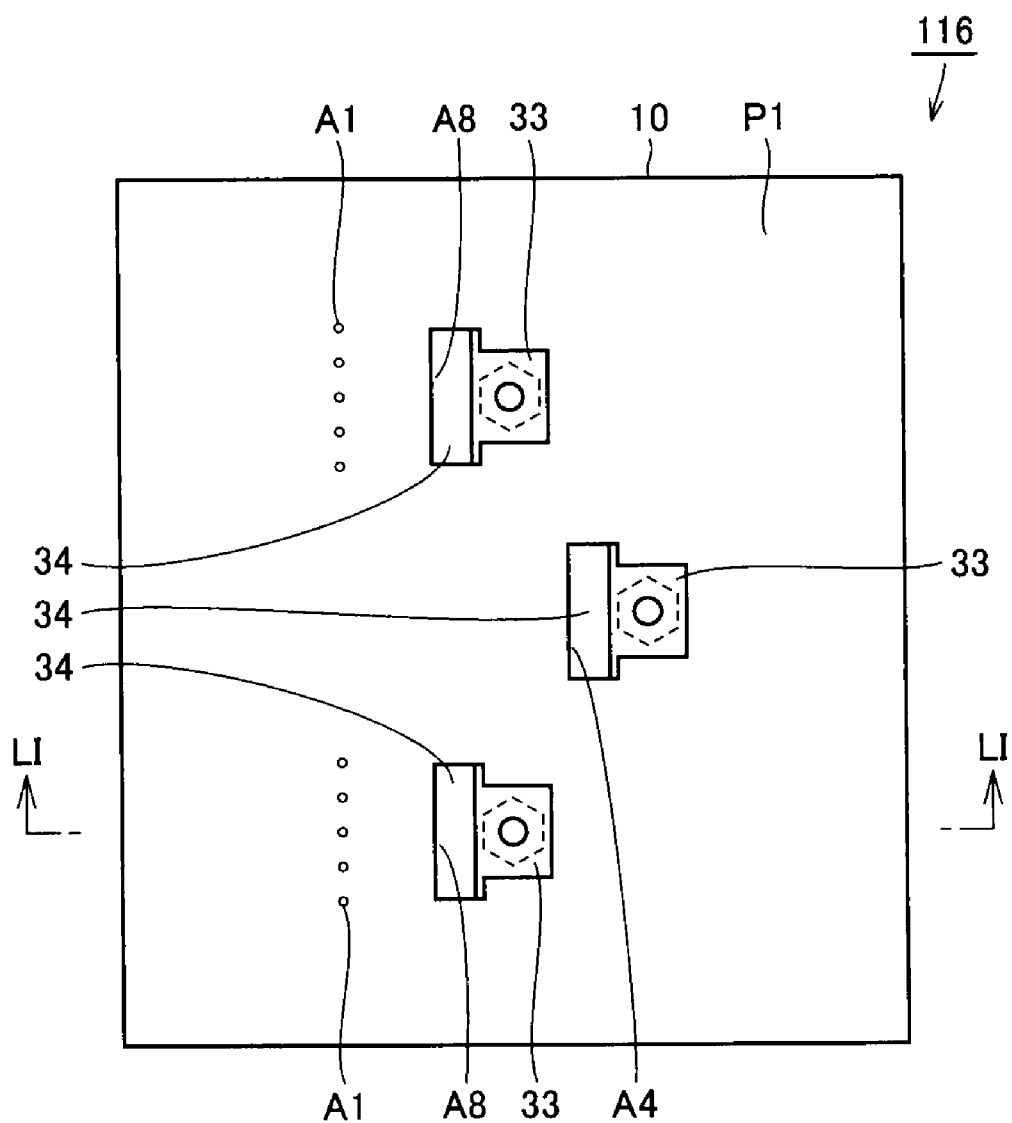
FIGS. 49 and 50 are plan views showing a configuration of a power module as a semiconductor device in a sixteenth embodiment of the present invention.
Figure 50:
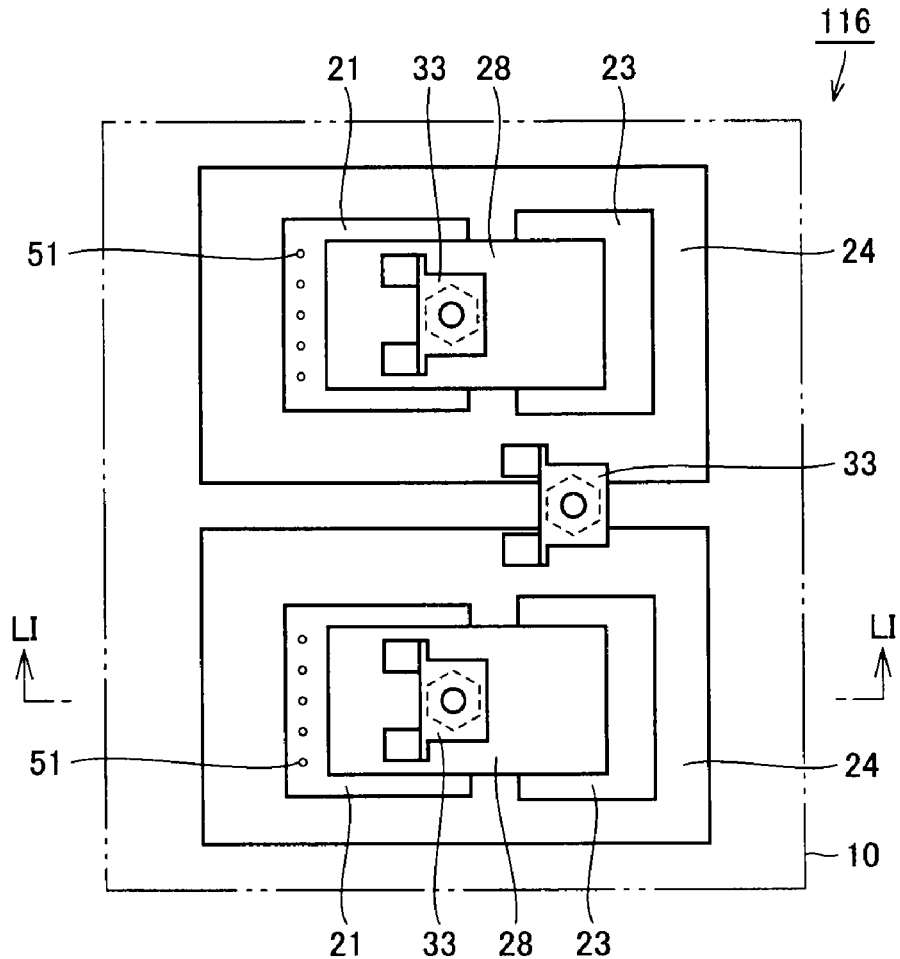
Figure 51:
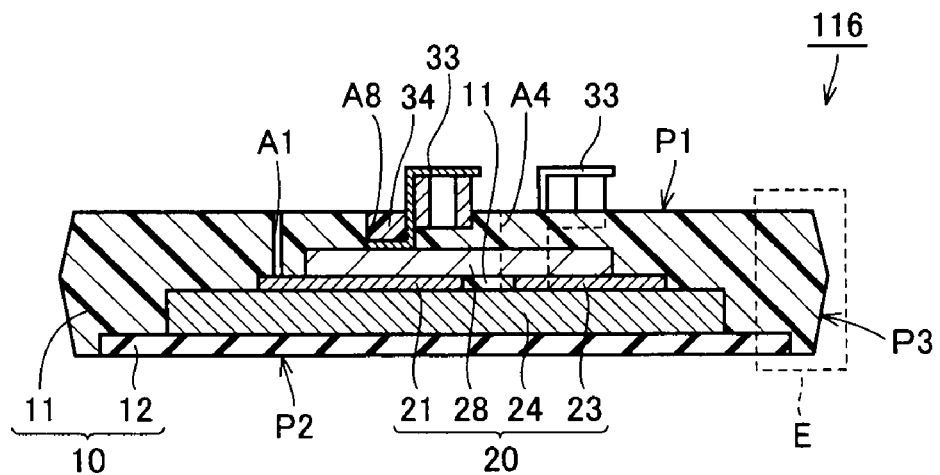
FIG. 51 is a schematic cross-sectional view along line LI-LI in each of FIGS. 49 and 50.

First, a configuration of a power module as a semiconductor device in the present embodiment is described using FIGS. 49-51.

Referring mainly to FIGS. 49 and 50, a power module 116 as the semiconductor device in the present embodiment has a plurality of electrodes 33 and filler resin portions 34. Encapsulation member 10 includes contact holes A1, A4 and A8. Contact hole A4 spreads across two heat spreaders 24, whereby part of the surface on the first plane P1 side of each heat spreader 24 is exposed from encapsulation member 10.

Filler resin portion 34 is a filler member made of an insulator that is injected to fill a cavity portion of contact holes A4 and A8 where electrodes 33 are provided.

Electrodes 33 are provided so that they protrude from the first plane P1 through contact holes A4 and A8, respectively. Electrodes 33 passing through contact holes A8 are electrically connected to frame 28. Electrode 33 passing through contact hole A4 is electrically connected to two heat spreaders 24. Each electrode 33 is provided with a screw hole TH (FIGS. 52 and 53) of the identical shape.

Figure 54:
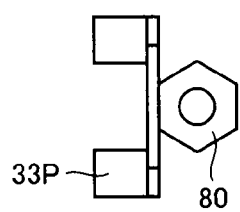
FIG. 54 is a schematic plan view showing a manufacturing step of the electrode used in the power module as the semiconductor device in the sixteenth embodiment of the present invention.
Figure 55:
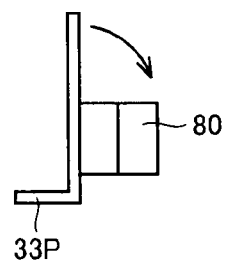
FIG. 55 is a schematic side view showing a manufacturing step of the electrode used in the power module as the semiconductor device in the sixteenth embodiment of the present invention.

As shown in FIGS. 54 and 55, electrode 33 can be manufactured with a bent plate-like member 33P and nut 80 having a screw hole.

The remainder of the configuration is substantially the same as that in the fourteenth embodiment described above, and therefore the identical or corresponding elements are denoted by the identical reference characters and description thereof is not repeated.

Next, a configuration in which control substrate 70 is added to power module 116 in the present embodiment is described.

Figure 52:
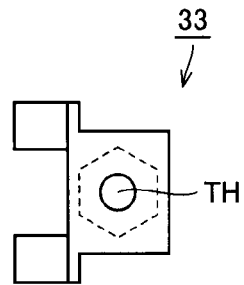
FIG. 52 is a plan view schematically showing a configuration of an electrode used in the power module as the semiconductor device in the sixteenth embodiment of the present invention.
Figure 53:
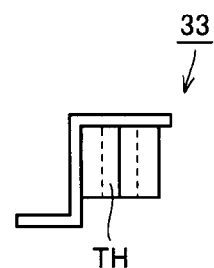
FIG. 53 is a side view schematically showing a configuration of the electrode used in the power module as the semiconductor device in the sixteenth embodiment of the present invention.
Figure 56:
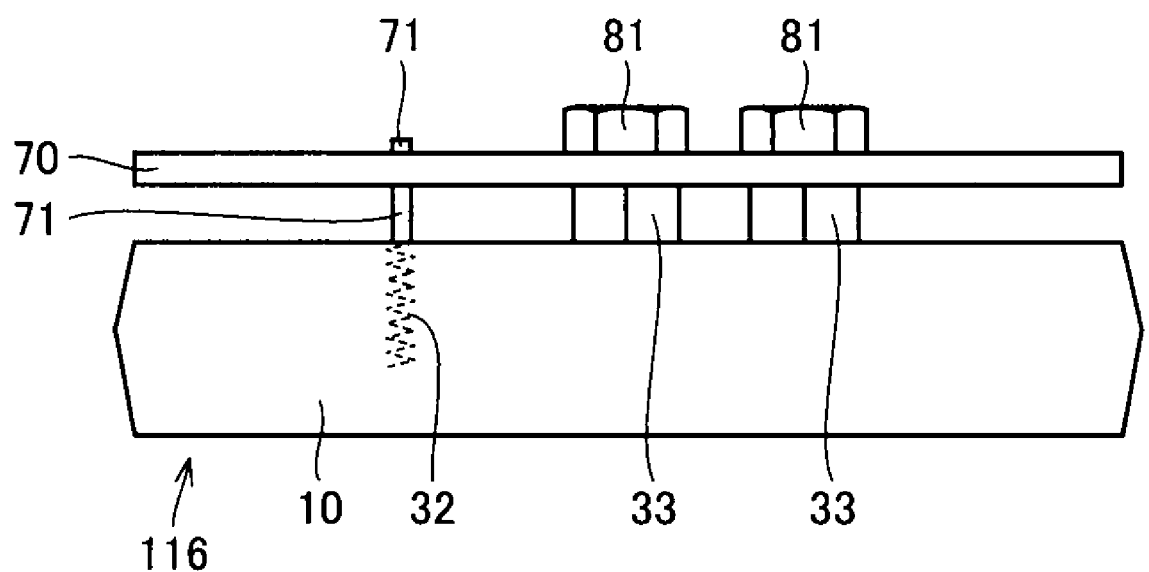
FIG. 56 is a schematic side view showing a state where a control substrate is added to the power module as the semiconductor device in the sixteenth embodiment of the present invention.

Referring mainly to FIG. 56, control substrate 70 is attached to power module 116 by screws 81 screwed into screw holes TH (FIGS. 52 and 53).

Next, a configuration in which a heat dissipation fin is added to power module 116 in the present embodiment is described.

Referring to FIG. 57, a heat dissipation fin 83 is added to second plane P2 of power module 116. Heat dissipation fin 83 has a function of improving heat dissipation efficiency from the second plane P2 side of power module 116.

Figure 58:
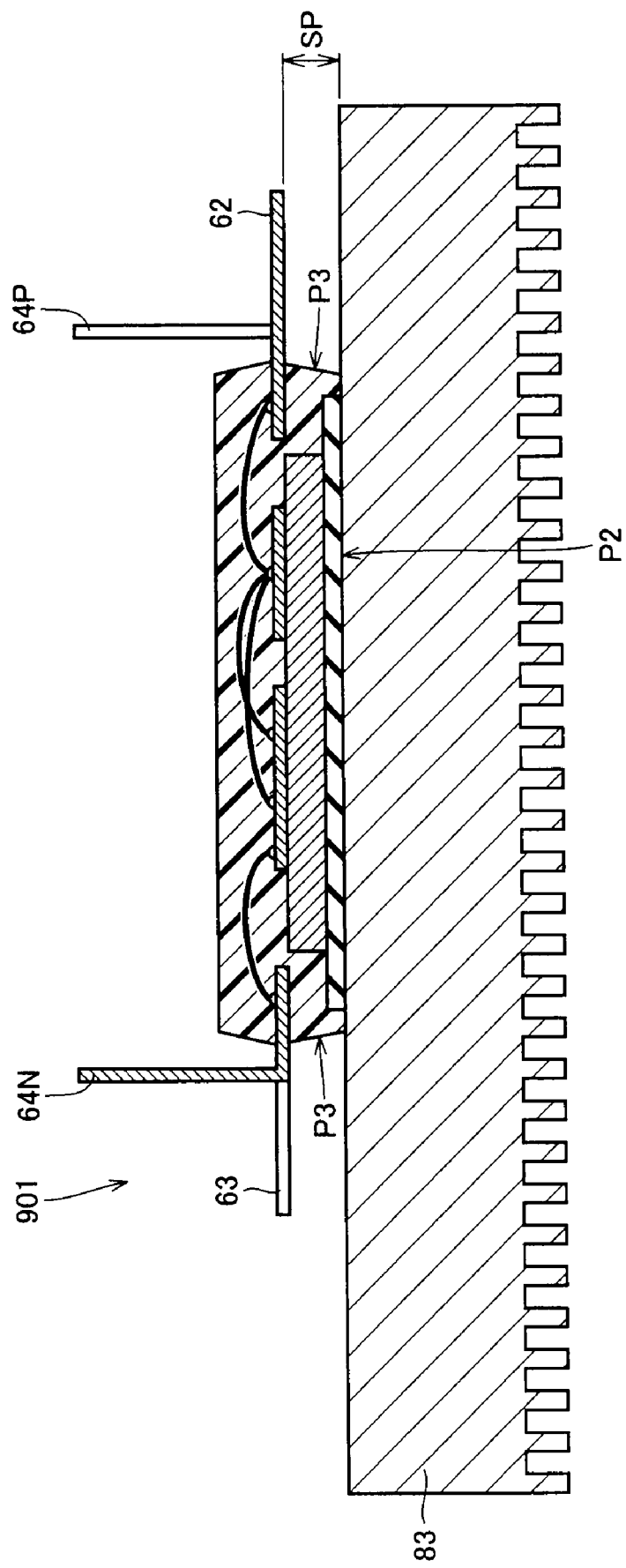
FIG. 58 is a cross-sectional view schematically showing a configuration where a heat dissipation fin is added to a power module as a semiconductor device in a comparative example.

Referring mainly to FIG. 58, to second plane P2 of power module 901 (FIGS. 14-16), heat dissipation fin 83 is added. Lead 62 protrudes from third plane P3 of power module 901. The surface of heat dissipation fin 83 is positioned at a position distanced from lead 62 by a spatial distance SP. In order for power module 901 to withstand greater voltages, adequate spatial distance SP must be kept. However, greater spatial distance SP increases power module 901 in size.

According to the present embodiment, being different from power module 901 (FIG. 16) in the comparative example, as shown in FIG. 51, wires 40 (FIG. 16) are not provided within end portion E on the third plane P3 side of encapsulation member 10. Accordingly, it is not necessary to provide encapsulation member 10 for protecting wires 40 at end portion E. This provides a configuration where end portion E of encapsulation member 10 is eliminated, whereby power module 116 can be reduced in size.

As electrode 33 protrudes from first plane P1 as shown in FIG. 51, power module 116 and control substrate 70 arranged on the first plane P1 side can easily be connected to each other, as shown in FIG. 56.

As the lead protruding from the third plane P3 side can be eliminated as shown in FIG. 57, it is not necessary to design to keep spatial distance SP (FIG. 58), power module 116 can be reduced in size.

As shown in FIGS. 52 and 53, electrode 33 has screw hole TH. Thus, as shown in FIG. 56, power module 116 and control substrate 70 can be connected to each other by screw 81.

As shown in FIGS. 54 and 55, each electrode 33 is manufactured using nut 80 of the identical shape as the member. This common member usage reduces the manufacturing costs of power module 116. As nuts 80 of the identical shape are used, as shown in FIG. 56, screws 81 for attaching control substrate 70 to power module 116 can be common.

Electrodes 33 are respectively electrically connected, with frame 28 interposed, to IGBT element 21 and diode element 23. As frame 28 increases the width of the electric path, the inductance in the electric path can be suppressed.

Filler resin portion 34 is injected so as to fill the cavity portion of each of contact holes A4 and A8 where electrodes 33 are provided. If force pulling electrode 33 is exerted, filler resin portion 34 disperses the force and electrode 33 is prevented from being pulled out.

Seventeenth Embodiment

Figure 59:
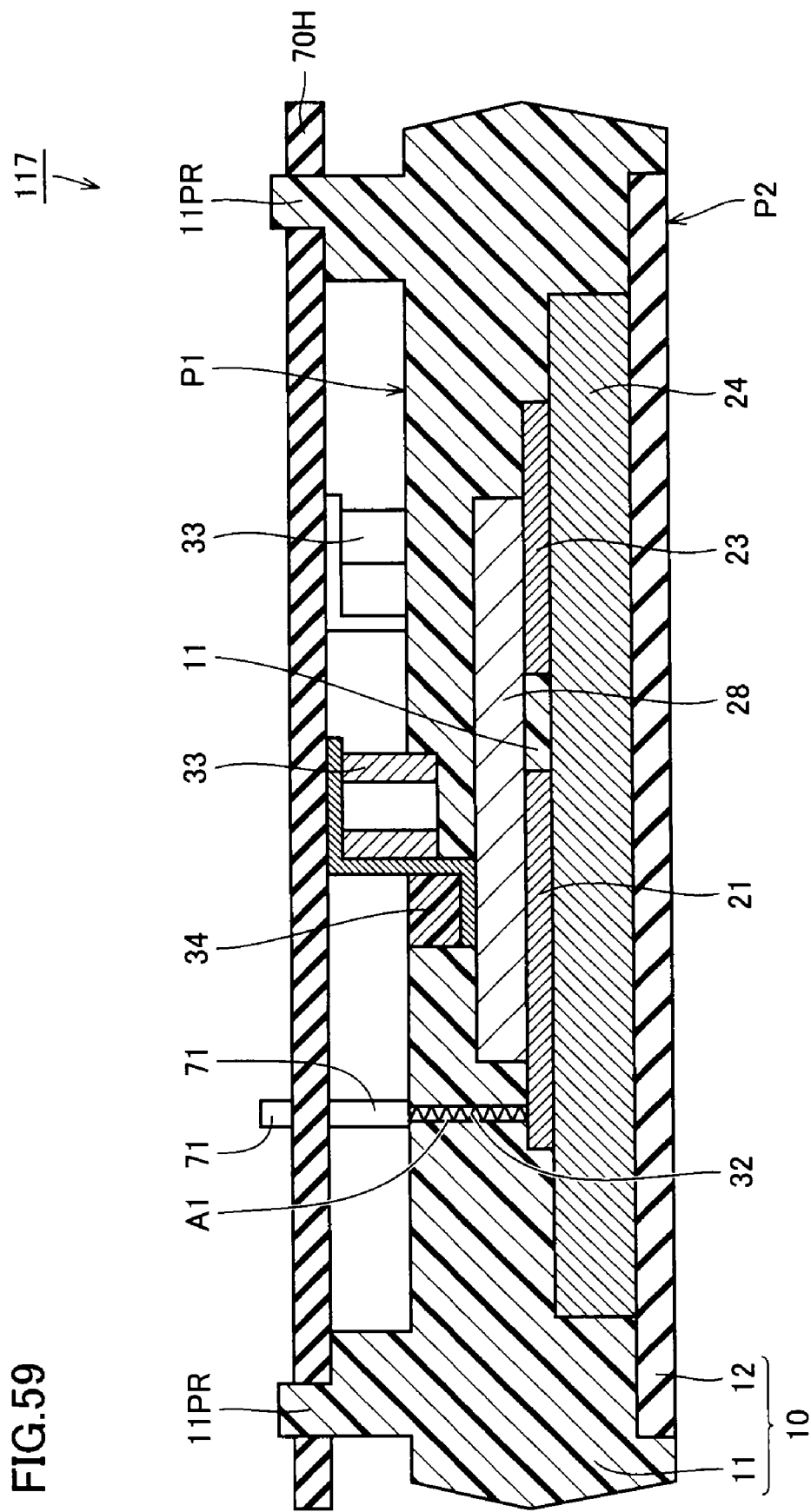
FIG. 59 is a schematic side view showing a state where a control substrate is further added to a power module as a semiconductor device in a seventeenth embodiment of the present invention.

Referring to FIG. 59, in a power module 117 as a semiconductor device in the present embodiment, mold resin 11 of encapsulation member 10 has protrusions 11PR on first plane P1.

Control substrate 70H has holes into which protrusions 11PR are inserted. Control substrate 70H has a configuration similarly to that of control substrate 70 except that it has protrusions 11PR.

The remainder of the configuration is substantially the same as that of sixteenth embodiment described above, and therefore the identical or corresponding elements are denoted by the identical reference characters and description thereof is not repeated.

According to the present embodiment, insertion of protrusions 11PR into the holes of control substrate 70H achieves positioning between power module 117 and each of control substrate 70H and control signal pin 71.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device, comprising:
   an encapsulation-target portion having at least one semiconductor element; and
   an encapsulation member that has first and second planes between which said encapsulation-target portion is interposed, and that encapsulates said encapsulation-target portion, said encapsulation member having a plurality of openings that expose part of a surface of said encapsulation-target portion, said surface being on a side of said first plane, wherein said second plane of said encapsulation member is imperforated.

2. The semiconductor device according to claim 1, wherein said encapsulation member includes
   a resin member positioned on the side of said first plane relative to said encapsulation-target portion, and
   an insulating member that is positioned on a side of said second plane relative to said encapsulation-target portion and that is made of a material being higher in thermal conductivity than a material of said resin member.

3. The semiconductor device according to claim 1, wherein said at least one semiconductor element includes at least one semiconductor switching element that performs switching in accordance with a control signal, and
   said semiconductor switching element has a control pad that receives said control signal and that is opposed to at least one of said plurality of openings.

4. The semiconductor device according to claim 3, further comprising
   a control substrate outputting said control signal, wherein
   said control pad and said control substrate are electrically connected to each other via at least one of said plurality of openings.

5. The semiconductor device according to claim 1, wherein said at least one semiconductor element includes a pair of semiconductor elements, and
   said encapsulation-target portion has a frame on said pair of semiconductor elements and on the side of said first plane, that electrically connects said pair of semiconductor elements to each other.

6. The semiconductor device according to claim 1, wherein said encapsulation member has a third plane connecting said first and second planes to each other, said semiconductor device further comprising
   a lead that is electrically connected to said encapsulation-target portion and that is protruding from inside of said encapsulation member through said third plane.

7. The semiconductor device according to claim 6, wherein in a plan view as seen from the side of said first plane, a center line of said lead along a direction to which said lead protrudes and a center line of said encapsulation member are identical.

8. The semiconductor device according to claim 1, wherein at least one of said plurality of openings has a circular cross-sectional shape.

9. The semiconductor device according to claim 1, wherein said encapsulation-target portion has a metallization layer being opposed to at least one of said plurality of openings.

10. The semiconductor device according to claim 1, wherein said encapsulation-target portion has a block made of a conductor being opposed to at least one of said plurality of openings.

11. The semiconductor device according to claim 1, wherein at least one of said plurality of openings is filled with a conductor.

12. The semiconductor device according to claim 11, wherein
    said encapsulation-target portion has a heat spreader joined by a joining member on a side of said second plane relative to said at least one semiconductor element, and
    a melting point of said conductor is lower than a melting point of said joining member.

13. The semiconductor device according to claim 11, wherein
    said encapsulation-target portion has, in a position opposed to said at least one of said plurality of openings filled with said conductor, a block made of a conductor.

14. The semiconductor device according to claim 1, further comprising
    inside at least one of said plurality of openings, a connection member made of a conductor that is elastically deformable in a direction crossing said first plane.

15. The semiconductor device according to claim 1, wherein
    at least one of said plurality of openings has its inside on a side of said second plane filled with a conductor, and
    said at least one of said plurality of openings has its inside on the side of said first plane provided with a elastically deformable connection member made of a conductor.

16. The semiconductor device according to claim 1, wherein
    said at least one semiconductor element includes a pair of semiconductor elements,
    said encapsulation-target portion has a frame on said pair of semiconductor elements and on the side of said first plane, said frame electrically connecting said pair of semiconductor elements to each other, and
    at least one of said plurality of openings is positioned on said at least one semiconductor element, having said frame interposed therebetween.

17. The semiconductor device according to claim 1, wherein
    said encapsulation-target portion has a plurality of heat spreaders each made of a conductor, said plurality of heat spreaders being provided on a side of said second plane relative to said at least one semiconductor element, and
    said encapsulation member has a third plane connecting said first and second planes to each other, said semiconductor device further comprising
    a lead that is provided so as to protrude from inside said encapsulation member through said third plane and to electrically connect said plurality of heat spreaders to each other.

18. The semiconductor device according to claim 1, further comprising
    at least one electrode provided so as to protrude from said first plane through one of said plurality of openings.

19. The semiconductor device according to claim 18, wherein
    a screw hole is provided to a protruding portion of said at least one electrode.

20. The semiconductor device according to claim 18, wherein
    said at least one electrode is a plurality of electrodes, and
    said plurality of electrodes are each provided with a screw hole of identical shape.

21. The semiconductor device according to claim 18, wherein
said encapsulation-target portion has a frame made of a conductor that is provided on said at least one semiconductor element and on the side of said first plane, and
said at least one electrode is electrically connected to said frame.

22. The semiconductor device according to claim 18, further comprising a filler member made of an insulator that is injected to fill a cavity portion of said at least one of said plurality of openings where said at least one electrode is provided.

23. The semiconductor device according to claim 18, wherein
said encapsulation member has a protrusion on said first plane.

* * * * *